(12) United States Patent
Kabasawa et al.

(10) Patent No.: US 8,952,340 B2
(45) Date of Patent: Feb. 10, 2015

(54) HIGH-FREQUENCY ACCELERATION TYPE ION ACCELERATION AND TRANSPORTATION APPARATUS HAVING HIGH ENERGY PRECISION

(71) Applicant: SEN Corporation, Tokyo (JP)

(72) Inventors: Mitsuaki Kabasawa, Ehime (JP); Tatsuo Nishihara, Ehime (JP); Kazuhiro Watanabe, Ehime (JP); Yuuji Takahashi, Ehime (JP); Tatsuya Yamada, Ehime (JP)

(73) Assignee: SEN Corporation, Tokyo (JP)

( * ) Notice: Subject to any disclaimer, the term of this patent is extended or adjusted under 35 U.S.C. 154(b) by 0 days.

(21) Appl. No.: 14/313,128

(22) Filed: Jun. 24, 2014

(65) Prior Publication Data
US 2014/0374617 A1    Dec. 25, 2014

(30) Foreign Application Priority Data

Jun. 24, 2013 (JP) ................................ 2013-131358

(51) Int. Cl.
*G21K 1/08* (2006.01)
*H01J 3/14* (2006.01)
*H01J 3/26* (2006.01)
*H01J 49/42* (2006.01)

(52) U.S. Cl.
CPC ....................................... *H01J 3/26* (2013.01)
USPC .................. 250/396 R; 250/306; 250/492.21; 250/396 ML

(58) Field of Classification Search
USPC .................. 250/306, 492.21, 396 R, 396 ML
See application file for complete search history.

(56) References Cited

U.S. PATENT DOCUMENTS

| | | | |
|---|---|---|---|
| 5,300,891 A | 4/1994 | Tokoro | |
| 7,315,034 B2 * | 1/2008 | Yagita et al. | 250/492.21 |
| 7,423,276 B2 * | 9/2008 | Yagita | 250/492.21 |
| 2014/0150723 A1 * | 6/2014 | Kabasawa et al. | 118/723 R |

FOREIGN PATENT DOCUMENTS

| JP | 3374335 B2 | 2/2003 |
|---|---|---|
| JP | 3448731 B2 | 9/2003 |

* cited by examiner

*Primary Examiner* — Nikita Wells
*Assistant Examiner* — Meenakshi Sahu
(74) *Attorney, Agent, or Firm* — Rader, Fishman & Grauer PLLC

(57) ABSTRACT

A high-frequency acceleration type ion acceleration and transportation apparatus is a beamline after an ion beam is accelerated by a high-frequency acceleration system having an energy spread with respect to set beam energy and includes an energy analysis deflection electromagnet and a horizontal beam focusing element. In the ion acceleration and transportation apparatus, a double slit that is configured by an energy spread confining slit and an energy analysis slit is additionally disposed at a position at which energy dispersion and a beam size are to be appropriate. The position is determined based on a condition of the energy analysis deflection electromagnet and the horizontal beam focusing element, and the double slit performs energy separation and energy definition and decreases the energy spread of the ion beam by performing adjustment for a smaller energy spread while suppressing a decrease in the amount of a beam current.

19 Claims, 29 Drawing Sheets

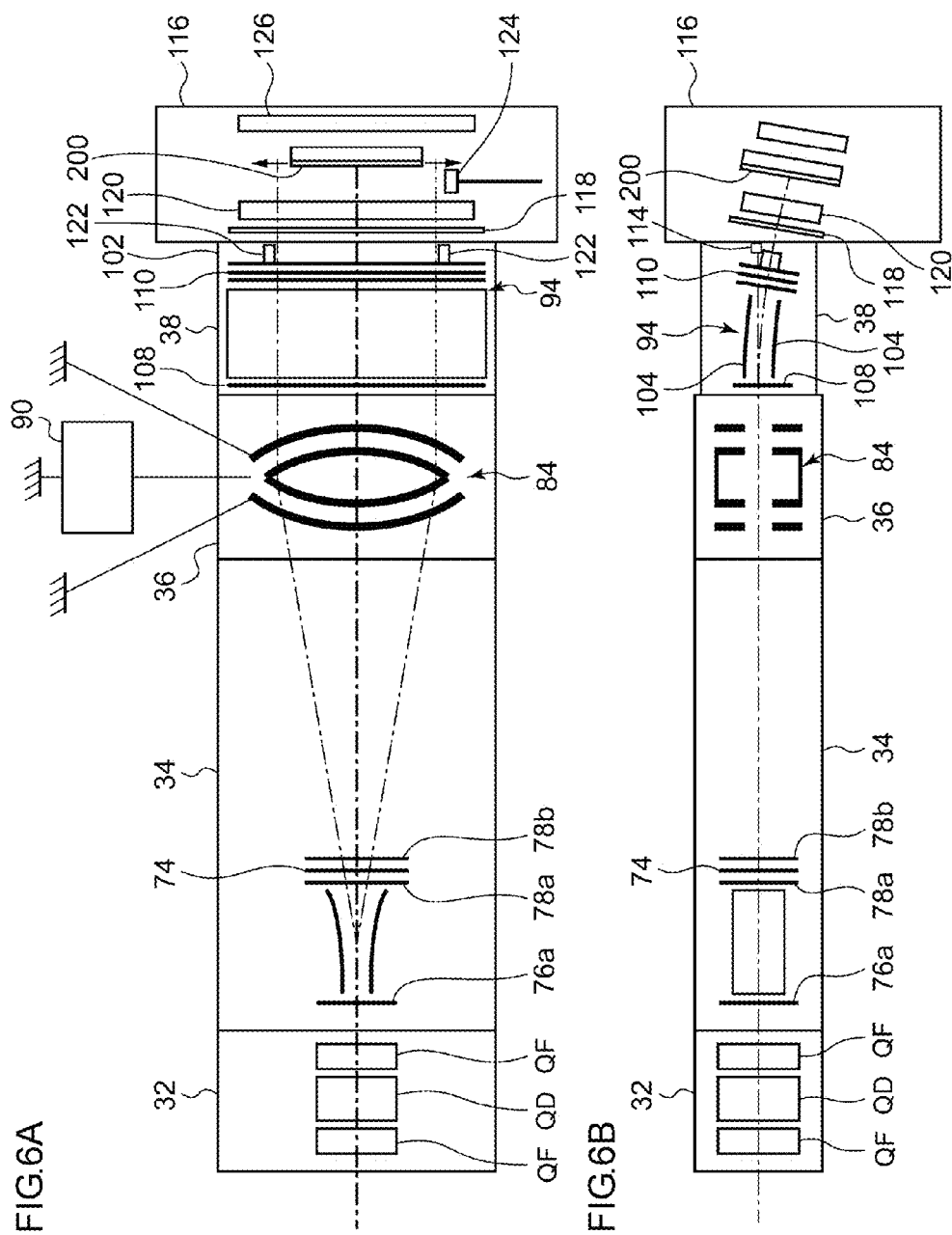

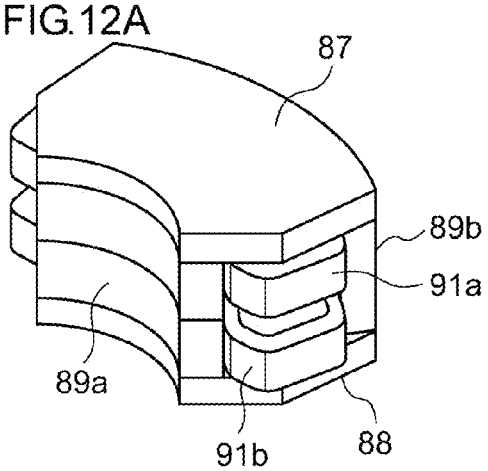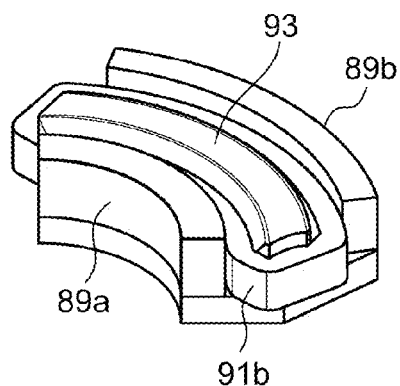

HIGH-FREQUENCY ACCELERATION TYPE ION ACCELERATION AND TRANSPORTATION APPARATUS HAVING HIGH ENERGY PRECISION

BACKGROUND OF THE INVENTION

1. Field of the Invention

The present invention relates to an apparatus that uses a high-frequency acceleration type ion beam having an energy spread that is accelerated using a high-frequency accelerator such as a linear accelerator or a synchrotron for an energy analysis.

2. Description of the Related Art

The high-frequency acceleration type acceleration of ions using a high-frequency electric field is used in a high-energy ion implanter that is used for introducing impurities to a silicon wafer, a heavy-ion cancer treatment apparatus that is used for causing cancer cells to disappear in a pinpoint manner, and the like. Different from an ion beam accelerated by a constant voltage, an ion beam (a group of ions) accelerated by a high-frequency electric field has a spread of energy (energy spread) of some degree.

For example, in a high-energy ion implanter that is one of a conventional ion acceleration and transportation apparatus, a simple energy analysis system that is configured by one analysis electromagnet and one energy defining slit are installed to the downstream side of a linear accelerator (high-frequency linear accelerator), a center portion of a beam having an energy spread is cut out, the energy is arranged to be uniform to some degree, and the ion beam is configured to be driven into a silicon wafer.

While the beam accelerated by the high-frequency linear accelerator has an energy spread (energy distribution) of a maximum of several % with respect to the set beam energy due to the oscillation of synchrotron, it is required to adjust the accelerated beam to a smaller energy spread in accordance with a request for high energy precision. In addition, since there are cases where the acceleration phase and the traveling time of ions slightly change depending on the type of the ions and the adjustment state of the high-frequency linear accelerator, there is a possibility that the central value (beam energy) of the energy spread (energy distribution) deviates in the range of several % that is the same degree of the energy spread. Thus, in the case where there is such a slight center energy deviation, the characteristics may get out of order depending on a semiconductor device.

SUMMARY OF THE INVENTION

The present invention is contrived in consideration of such situations, and an object thereof is to protect high energy precision by performing a high precision energy analysis of an ion beam having an energy spread and suppressing a deviation of the energy.

In order to solve the above-described problem, there is provided a high-frequency acceleration type ion acceleration and transportation apparatus having high energy precision that accelerates an ion beam using a high-frequency acceleration type acceleration system and includes a beamline after the acceleration of the ion beam, and the beamline includes an energy analysis deflection electromagnet and a horizontal beam focusing element. In addition, a double slit that is configured by an energy spread confining slit and an energy analysis slit is additionally disposed at a position at which energy dispersion and a beam size are to be appropriate, wherein the position is determined based on a condition of the energy analysis deflection electromagnet and the horizontal beam focusing element, and the double slit performs energy separation and energy definition and decreases the energy spread of the ion beam by performing adjustment for a smaller energy spread while suppressing a decrease in the amount of a beam current so as to realize required energy precision. Furthermore, the required energy precision may be realized by decreasing a center energy deviation together with decreasing the energy spread. In addition, in the high-frequency acceleration type acceleration system, in a case where a slight center energy deviation occurs, the double slit may perform energy separation and energy definition and realize required energy precision by decreasing the center energy deviation of the ion beam while suppressing a decrease in the amount of the beam current.

BRIEF DESCRIPTION OF THE DRAWINGS

FIG. 6A is a top view illustrating a schematic configuration from a beam scanner to a substrate processing/supplying unit along a beamline after a beam collimator, and FIG. 6B is a side view illustrating a schematic configuration from a beam scanner to a substrate processing/supplying unit along a beamline after a beam collimator;

FIGS. 12A and 12B are perspective views illustrating an example of a configuration of an electromagnet;

FIG. 16A is a top view illustrating a schematic configuration from a beam focusing/defocusing unit to a beam scanner according to this embodiment, and FIG. 16B is a side view illustrating a schematic configuration from the beam focusing/defocusing unit to the beam scanner according to this embodiment;

DETAILED DESCRIPTION OF THE INVENTION

Figure 1:
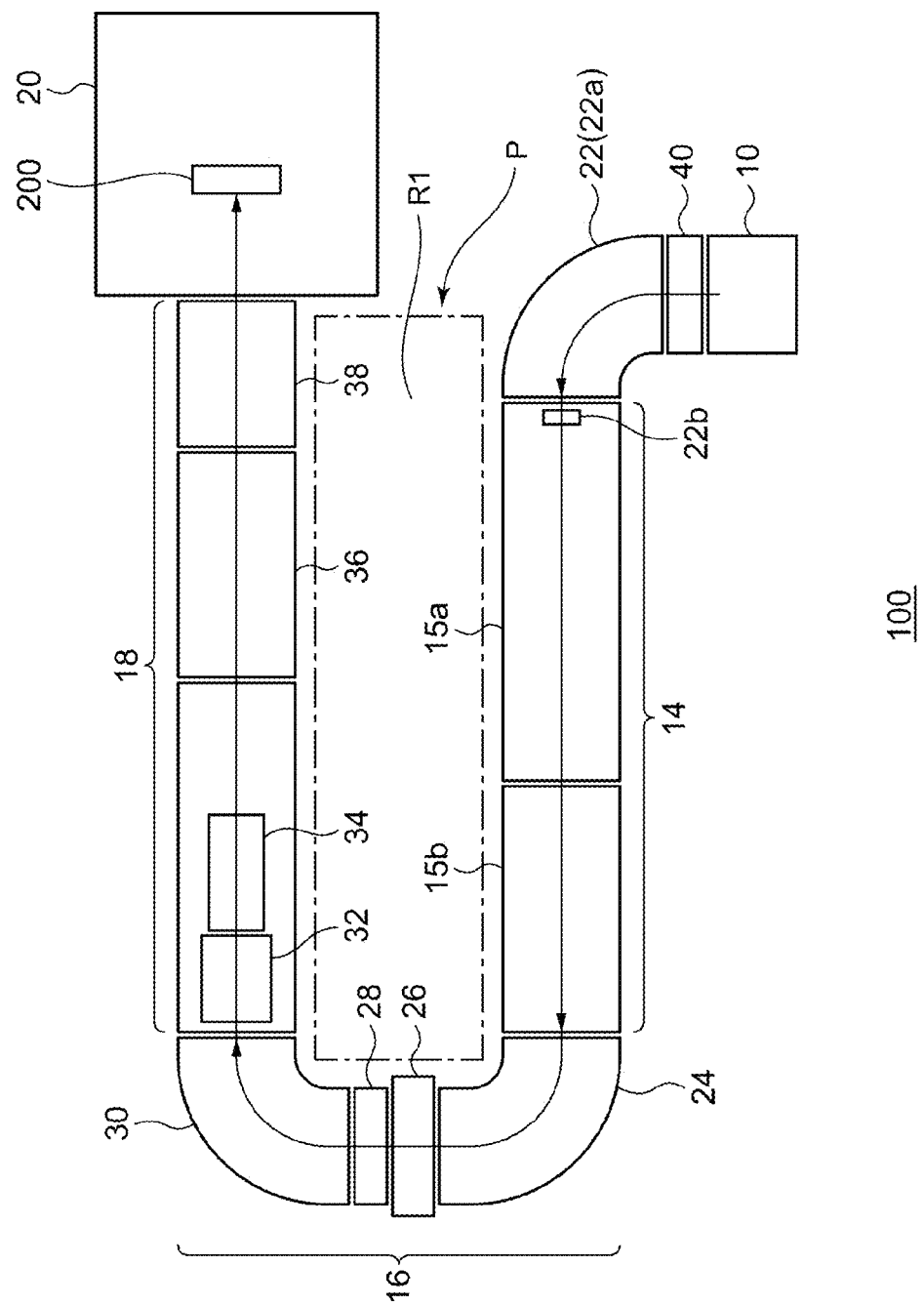
FIG. 1 is a schematic view illustrating a schematic layout and a beamline of a high-energy ion implanter according to an embodiment.

The invention will now be described by reference to the preferred embodiments. This does not intend to limit the scope of the present invention, but to exemplify the invention.

Hereinafter, an example of a high-energy ion implanter that is a high-frequency acceleration type ion acceleration and transportation apparatus having high energy precision according to this embodiment will be described in more detail. First, the details of devising of the present invention that is performed by the inventors of this application will be described.

An apparatus according to the present invention includes: a beam extraction system that generates an ion beam by extracting ions generated by an ion source from a static electric field; a high-frequency accelerator that further accelerates the extracted ion beam; at least one convergence element that is used for adjusting the beam size (spatial distribution) of the accelerated beam; and at least one deflection electromagnet that is used as an energy analysis electromagnet. In addition, an energy spread confining slit and an energy analysis slit are installed to the downstream side of the energy analysis electromagnet.

The convergence element used for adjusting the beam size (the spatial distribution of ions) is installed between the high-frequency accelerator and the energy analysis electromagnet and between the energy analysis electromagnet and the energy analysis slit and is adjusted such that a beam (a beam transported with energy as is extracted without applying a high-frequency electric field to the high-frequency accelerator) having no energy spread is focused at the position of the energy defining slit.

The orbit of each ion configuring the ion beam having an energy spread is caused to spatially spread within the deflection plane in accordance with energy when the ion beam is deflected by the energy analysis electromagnet (energy dispersion). The energy spread confining slit is disposed at a position at which the energy dispersion is of the same level as the beam size of a beam having no energy spread on the upstream side of the energy analysis slit. The position is near the exit of the energy analysis electromagnet.

The energy analysis using the energy analysis electromagnet and two slits arranged as described above will be described below in detail for a case where there are two 90°-deflected electromagnets, and two slits are installed therebetween as an example.

The size σ(s) of the ion beam in the horizontal direction (the direction perpendicular to the beam axis) within a horizontal plane (deflection plane) for an arbitrary position (a path length from the start point of the beamline) on the center axis of the beamline is provided in the following Equation (1).

[Equation 1]

$$\sigma(s) = \sqrt{\varepsilon\beta(s)} + \frac{1}{2}\left|\frac{\Delta_{EW}}{E}\eta(s)\right| \quad (1)$$

Here, ε is the emittance of the beam, E is beam energy, and $\Delta_{EW}$ is an energy spread. In addition, β(s) is called a betatron function (amplitude) and is a solution of the beam transportation equation. Furthermore, η(s) is called an energy dispersion function and is a solution of the energy-shifted beam transportation equation.

Individual ions inside the ion beam extracted from the ion source have positions and a distribution of angles with respect to the beam (a group of all the ions) center axis. Here, a graph having distances of individual ions from the beam center axis on the horizontal axis and angles formed by the traveling direction vectors of individual ions and the beam center axis on the vertical axis is called a phase space plot. The product (an area occupied by the beam in the phase space) of the distribution range of positions and the distribution range of angles is called emittance, and, when the emittance is normalized with respect to the momentum, it is a constant amount that does not change from the extraction port of the ion source to the end edge of the beam transmission path.

[Equation 2]

$$\sigma_1 = \sqrt{\varepsilon\beta} \quad (2)$$

The first term of Equation (1) described above as represented in Equation (2) is a beam width $\sigma_1$ formed by the initial ion distribution and, hereinafter, the beam width $\sigma_1$ will be referred to as a "beam width derived from the emittance". While the emittance is defined independently in the horizontal direction and in the vertical direction, only the horizontal direction is of significance here, and, hereinafter, unless otherwise noted, the emittance $\varepsilon$ represents the emittance of the horizontal direction.

As described above, in addition to the spread of the beam according to the spatial distribution, the beam accelerated by the high-frequency linear accelerator has an energy distribution (width). When the beam having the energy distribution (width) passes through the deflection electromagnet, an ion having relatively high energy follows an outer orbit having a large radius of curvature, and an ion having relatively low energy follows an inner orbit having a small radius of curvature. Accordingly, the beam is incident to the deflection electromagnet as one point (no spatial distribution), a spatial distribution (horizontal distribution) according to the energy spread is generated at the exit.

[Equation 3]

$$\sigma_2 = \frac{1}{2}\left|\frac{\Delta_{EW}}{E}\eta\right| \quad (3)$$

The second term of Equation (1) represented in Equation (3) represents a spatial distribution generated as the energy distribution changes. Hereinafter, a phenomenon in which the energy distribution changes to a spatial distribution in accordance with the deflection will be referred to as an energy distribution, and the beam width $\sigma_2$ generated as a result thereof will be referred to as a beam width derived from the energy distribution or simply as dispersion. Equation (1) represents that the beam size is a sum of a beam width derived from the emittance and a beam width derived from the energy dispersion.

In the invention of the present application, while two slits including the energy spread confining slit and the energy analysis slit are used, first, the distribution of the beam in an area from the energy analysis electromagnet to the energy analysis slit will be described in accordance with a conventional method in which a beam is cut using one energy analysis slit as an example.

Figure 22:
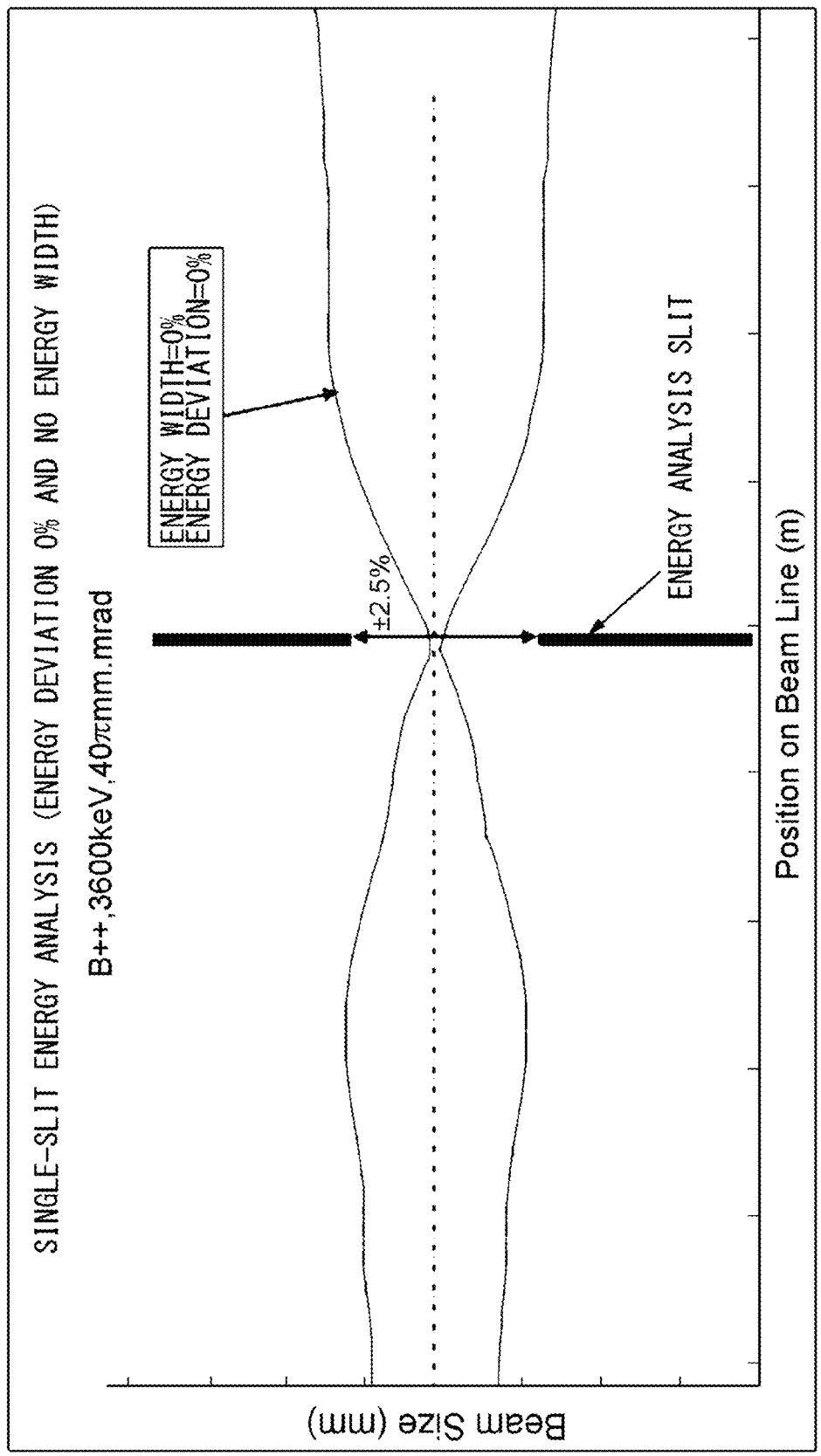
FIG. 22 is a schematic view illustrating the appearance of a beam having an energy spread of 0% and a center energy deviation of 0% passing through one energy analysis slit that is placed near the focal point.

FIG. 22 is a schematic view illustrating the appearance of a beam having an energy spread of 0% and a center energy deviation of 0% passing through one energy analysis slit that is placed near the focal point.

Figure 23:
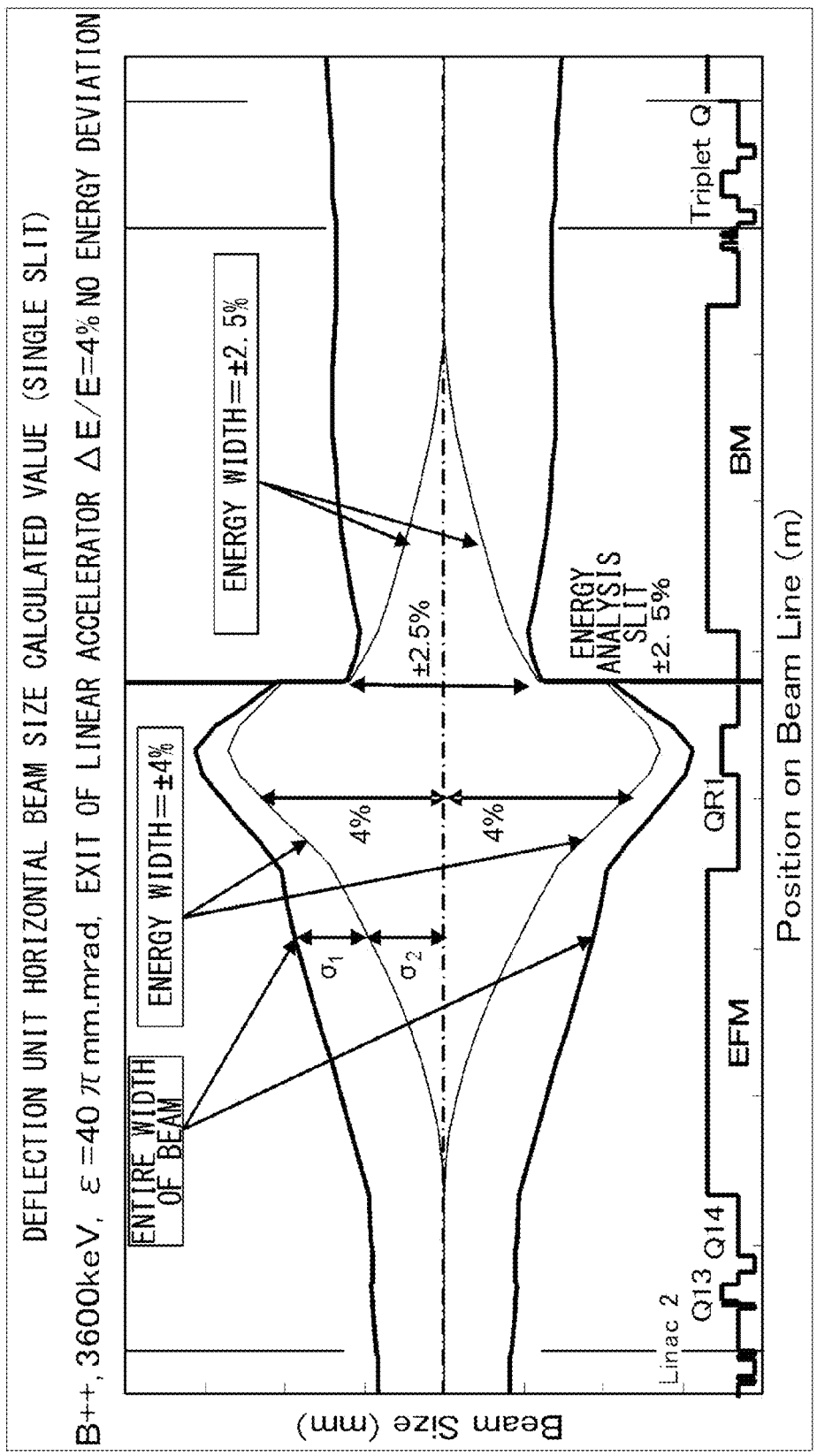
FIG. 23 is a schematic view illustrating the appearance of changing a beam originally having an energy spread of ±4% into a beam having an energy spread of ±2.5% by being cut by one energy analysis slit using a deflection unit.

FIG. 23 is a schematic view illustrating the appearance of changing a beam originally having an energy spread of ±4% into a beam having an energy spread of ±2.5% by being cut by one energy analysis slit using a deflection unit. The horizontal axis represents the path distance of an ion from the exit of the ion source, and the vertical axis represents the width of the beam and the opening width of each slit. Right above the horizontal axis, the positions of the energy analysis electromagnet (EFM), the deflection electromagnet (BM), and the like are illustrated.

Figure 24:
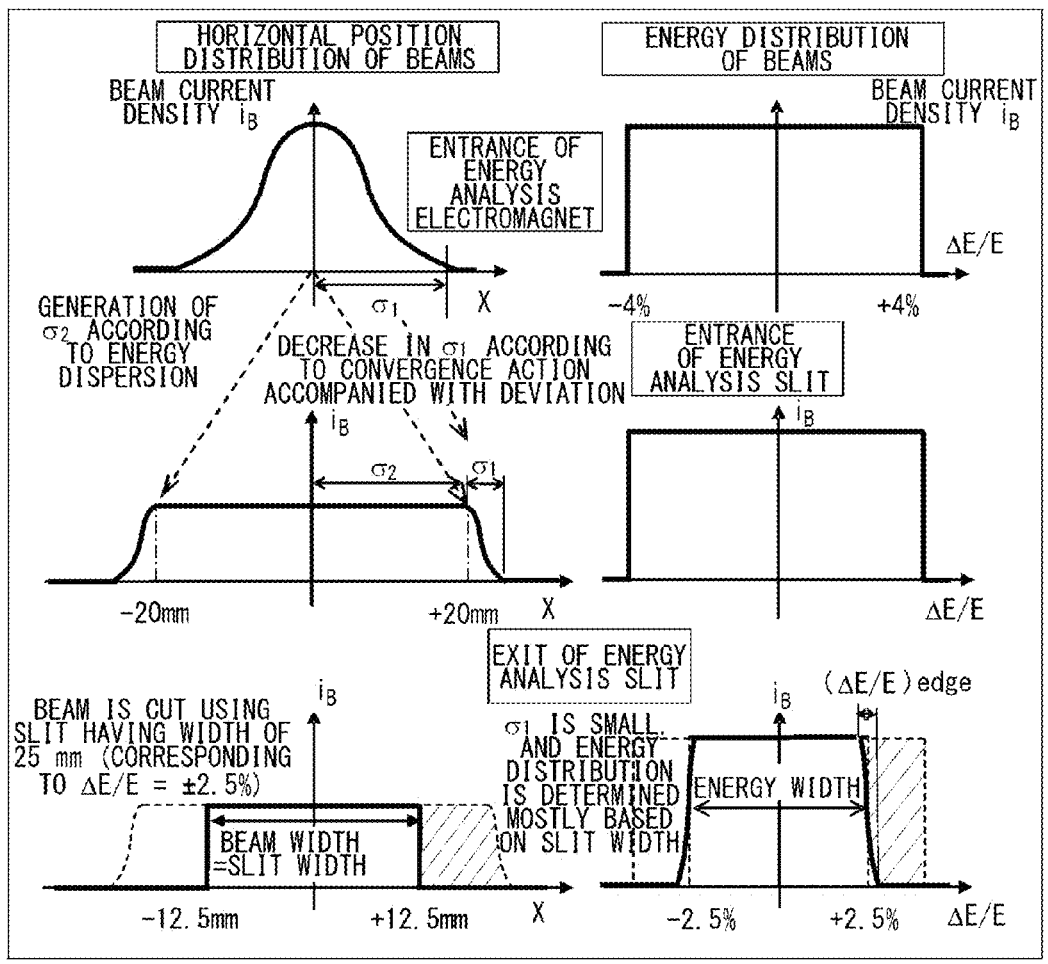
FIG. 24 is a diagram illustrating energy distributions corresponding to horizontal spatial distributions of beams at an entrance (near 5.6 m) of an energy analysis electromagnet (EFM) illustrated in FIG. 23 and an entrance and an exit (near 7.4 m) of the energy analysis slit.

FIG. 24 is a diagram illustrating energy distributions corresponding to horizontal spatial distributions of beams at an entrance (near 5.6 m) of an energy analysis electromagnet (EFM) illustrated in FIG. 23 and an entrance and an exit (near 7.4 m) of the energy analysis slit. The horizontal axis of the spatial distribution is a horizontal distance from the designed center orbit, and the horizontal axis of the energy distribution is a value acquired by dividing a difference from expected implantation energy by the expected implantation energy. The vertical axis is a beam current density (a number density of ions passing per unit time) for any of the distributions. The energy analysis slit is installed to a position at which the beam width derived from the emittance is minimum.

The spatial distribution at the entrance of the energy analysis electromagnet (EFM) is assumed to be a distribution close to the Gaussian distribution, and the energy distribution is assumed to be a uniform distribution. When the beam enters the EFM, and the dispersion starts, the horizontal spatial distribution is prolonged and spreads. The deflection electromagnet has a function for causing the beam width to converge (decrease β) according to the emittance together with an action for generating dispersion. Accordingly, the beam width $\sigma_2$ according to the dispersion represented in Equation (3) steadily increases, and the beam width $\sigma_1$ represented in Equation (2) steadily decreases, whereby the end portion of the horizontal spatial distribution is sharpened. Therebetween, the energy distribution does not change.

Between the EFM and the BM, a horizontal focusing lens QR1 is inserted. This lens has a function for causing the ion beam to reduce its dispersion by stopping the spread of the energy dispersion and decreasing further the beam width $\sigma_1$ derived from the emittance. Therefore, the position at which the beam width is minimum moves upstream to the EFM. Since the energy analysis slit is installed to a position at which the beam width $\sigma_1$ is minimum, the installation position moves to the EFM side, whereby the space can be saved. The beam width $\sigma_2$ derived from the energy dispersion is maximum near the center of the horizontal focusing lens QR1. If there is no horizontal focusing lens QR1, the spread of the dispersion continues to a position near the exit of the BM.

At the entrance of the energy analysis slit, the beam width $\sigma_2$ is extremely large, and the beam width $\sigma_1$ is minimum (the beam widths are adjusted as such by the horizontal focusing lens QR1 and the convergence element disposed at the exit of the high-frequency accelerator). Accordingly, the end portion of the horizontal spatial distribution is very sharp, and the spatial distribution has a shape (uniform distribution) close to the energy distribution as a whole.

This beam is spatially cut by the energy analysis slit. First, the general change in the shape of the energy distribution in accordance with the spatial cut will be described. This part is very important as a principle supporting the invention of the present application.

When the energy distribution is a rectangular distribution (uniform distribution), and the beam width $\sigma_2$ is sufficiently larger than the beam width $\sigma_1$ derived from the emittance and is sufficiently larger than the slit width $W_A$, the spatial distribution after the cut is a completely rectangular shape (uniform shape). At this time, the energy distribution is also cut to have the energy spread according to the slit width. The energy spread is as represented in Equation (4) based on Equation (3).

[Equation 4]

$$\frac{\Delta_{EW}}{E} = \pm \frac{W_A}{\eta} \tag{4}$$

However, the energy distribution that has been cut, different from the spatial distribution, is not a completely rectangular distribution. The reason for this is that both end portions of the energy distribution that has been cut includes non-uniform energy distribution derived from the energy spread corresponding to the beam width $\sigma_1$ derived from the emittance. When the energy spread corresponding to the beam width $\sigma_1$ is $\Delta E_{edge}/E$, the energy spread is acquired as Equation (5) similar to Equation (4).

[Equation 5]

$$\frac{\Delta E_{edge}}{E} = \pm \frac{2\sigma_1}{\eta} \tag{5}$$

In the range of the energy distribution end portions that is given in Equation (5), the beam current density changes from a value of the rectangular distribution toward zero.

In other words, the energy distribution of the beam that has been spatially cut into a rectangular distribution by the slit has a shape in which the beam current density rises from zero to a value before the cut in the section of $-W_A/\eta-2\sigma_1/\eta$ to $-W_A/\eta+2\sigma_1/\eta$, is constant (the value before the cut) in the section of $-W_A/\eta+2\sigma_1/\eta$ to $+W_A/\eta-2\sigma_1/\eta$, and falls to zero in the section of $+W_A/\eta-2\sigma_1/\eta$ to $+W_A/\eta+2\sigma_1/\eta$. Thus, the effective width has a value represented in Equation (4).

In this way, generally, the shapes of the horizontal spatial distribution and the energy distribution change before and behind the slit, and the energy distribution is not in the shape of a rectangle. However, as in the example illustrated in FIG. 24, in a case where the beam is cut by placing one energy analysis slit at the position of the focal point of the beam, the beam width $\sigma_1$ is sufficiently smaller than the slit width $W_A$ ($W_A$=25 mm and $\sigma_1$=0.6 mm), and the energy distribution that has been cut can be regarded as an approximately rectangular shape.

Figure 25:
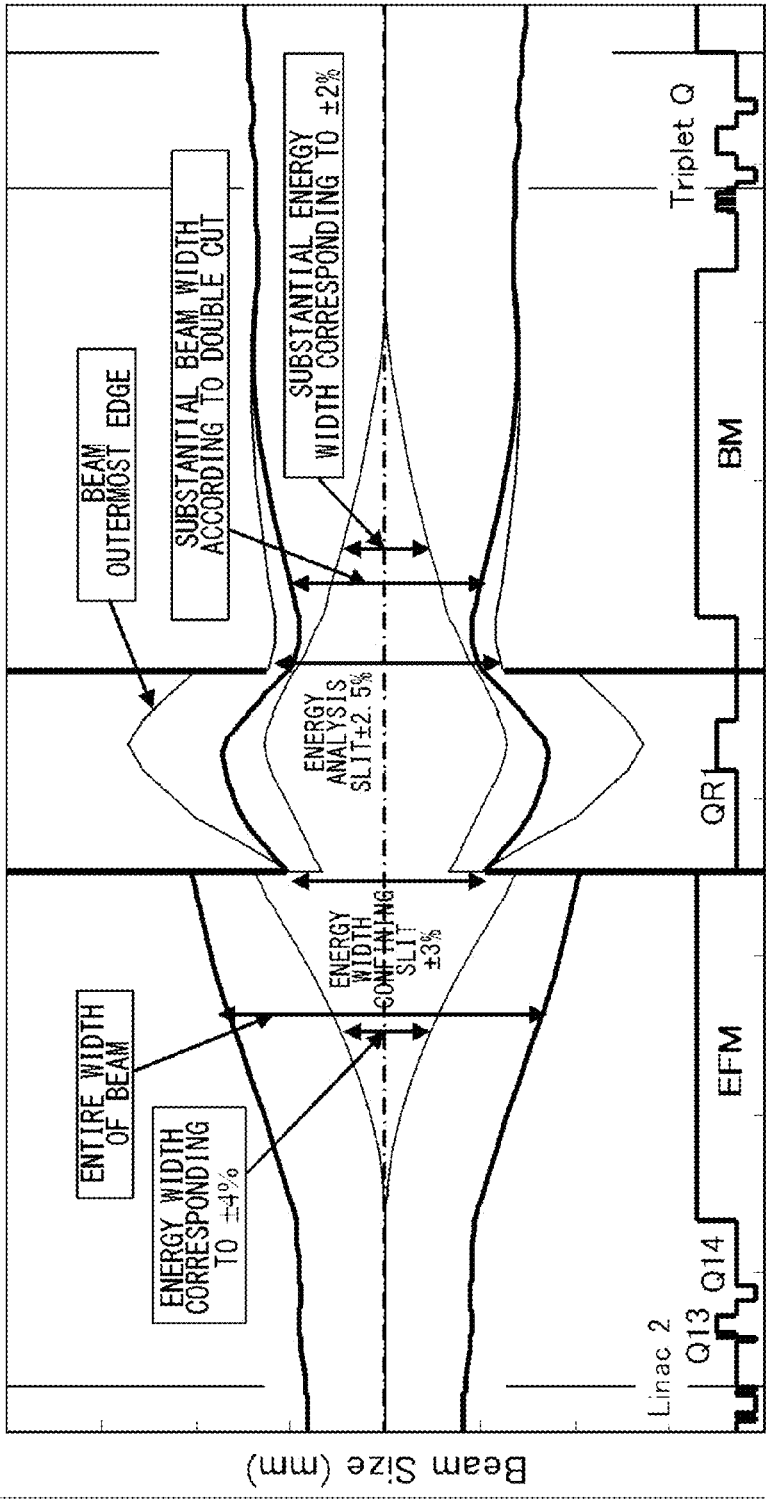
FIG. 25 is a schematic view illustrating the appearance of changing a beam originally having an energy spread of ±4% into a beam having an energy spread of ±2.5% by being cut by one energy analysis slit using a deflection unit including an energy spread confining slit and an energy analysis slit.
Figure 26:
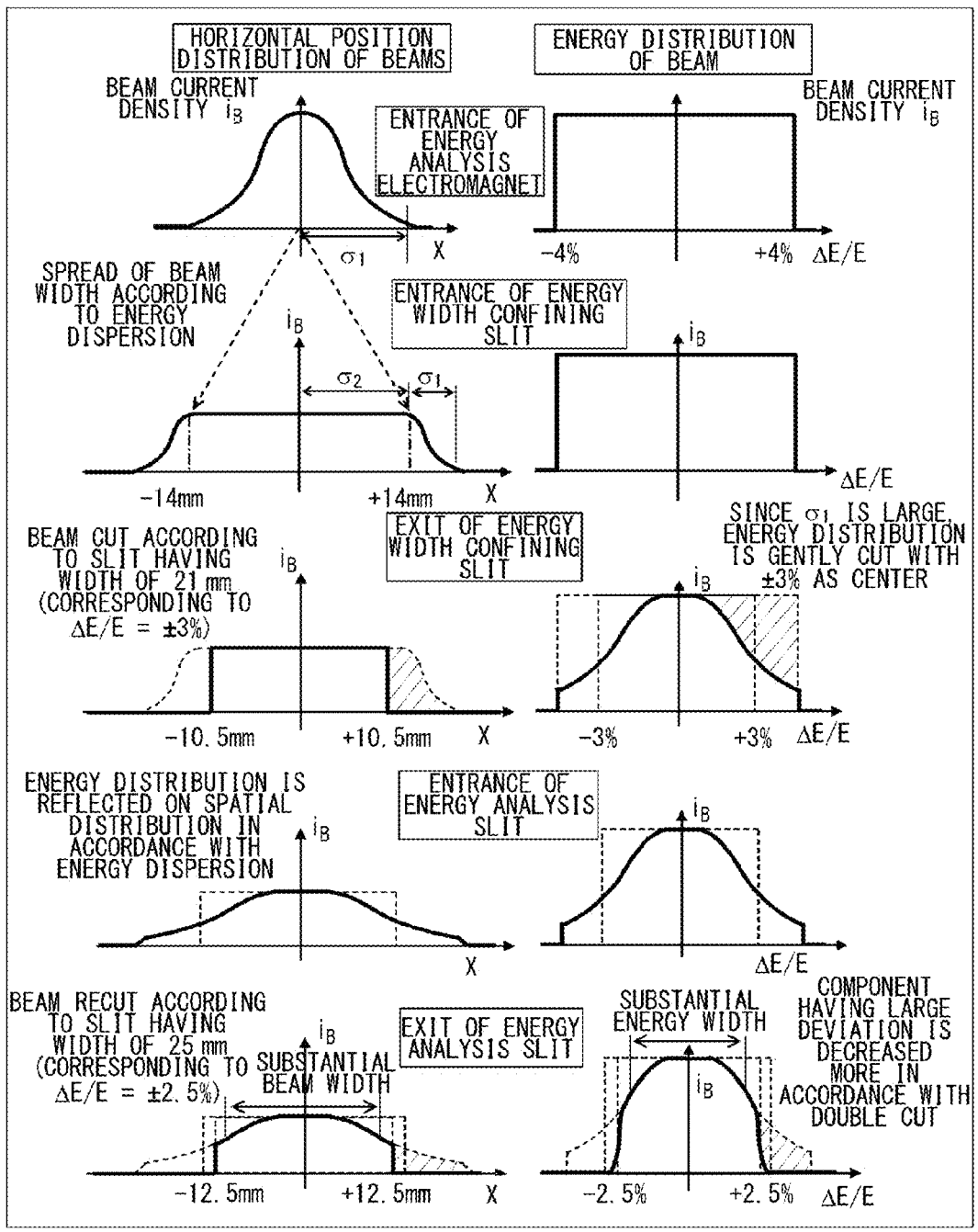
FIG. 26 is a diagram illustrating energy distributions corresponding to horizontal spatial distributions of beams at the entrance of the energy analysis electromagnet (EFM) illustrated in FIG. 25, an entrance and an exit of the energy spread confining slit, and the entrance and the exit of the energy analysis slit.

FIG. 25 is a schematic view illustrating the appearance of changing a beam originally having an energy spread of ±4% into a beam having an energy spread of ±2.5% by being cut by one energy analysis slit using a deflection unit including an energy spread confining slit and an energy analysis slit. FIG. 26 is a diagram illustrating energy distributions corresponding to horizontal spatial distributions of beams at the entrance of the energy analysis electromagnet (EFM) illustrated in FIG. 25, an entrance and an exit of the energy spread confining slit, and the entrance and the exit of the energy analysis slit.

Near the exit of the EFM, while the beam width $\sigma_2$ derived from the energy dispersion increases toward the maximum value, and the beam size $\sigma_1$ derived from the emittance decreases toward the minimum value, and the beam width $\sigma_2$ is larger than the beam size $\sigma_1$, however, the beam size $\sigma_1$ is still quite large. Here, when the beam is cut by placing the energy spread confining slit, the spatial distribution is temporarily a rectangular distribution. However, at that time, the effect of dulling the edge represented in Equation (5) is high, and the energy distribution is a gently sloping distribution far off a rectangular shape.

Even when the opening width of the energy spread confining slit, for example, is set to a value corresponding to the energy spread of 3%, the beam width $\sigma_1$ derived from the emittance is large, and accordingly, many ions each having an energy difference of 3% or more from the predetermined implantation energy pass. In accordance with the increase in the dispersion, the orbits of ions having energy that are shifted much steadily become far from the center, and, as a result, the beam size including the beam outer edge is quite large. For example, as in the case illustrated in FIG. 26, when the energy spread of the beam output from the high-frequency accelerator is 4%, and a sum of the energy spreads represented in Equations (4) and (5) calculated at the position of the energy spread confining slit exceeds 4%, the beam size including the outer edge is the same as that of a case where there is no energy spread confining slit. However, in accordance with the spread due to the cut and the dispersion according to the slit, the ion density of the outer edge portion is very low. As above, a portion of the beam outer edge, which is not cut by the slit, having a low density is called a halo.

In order to remove such a halo of the beam and settle the energy, the energy analysis slit is necessary at the position at which the beam width $\sigma_1$ is the minimum. As is illustrated in the last part of FIG. 26, even when the original energy distribution is a rectangular distribution, the energy distribution of the beam to which double filters are applied using the energy spread confining slit and the energy analysis slit changes to a bell-shaped distribution. Accordingly, the effective energy spread can be configured to be decreased by an amount corresponding to a relative increase in the density of the beam current of the center portion. In addition, generally, the energy distribution of the ion beam output from the high-frequency linear accelerator is originally in a bell shape, and accordingly, the effect of a decrease in the energy spread further increases.

In addition, the double slit, in addition to the function for decreasing in the energy spread, has a function for decreasing a center energy deviation for a beam having a slight center energy deviation.

Figure 27:
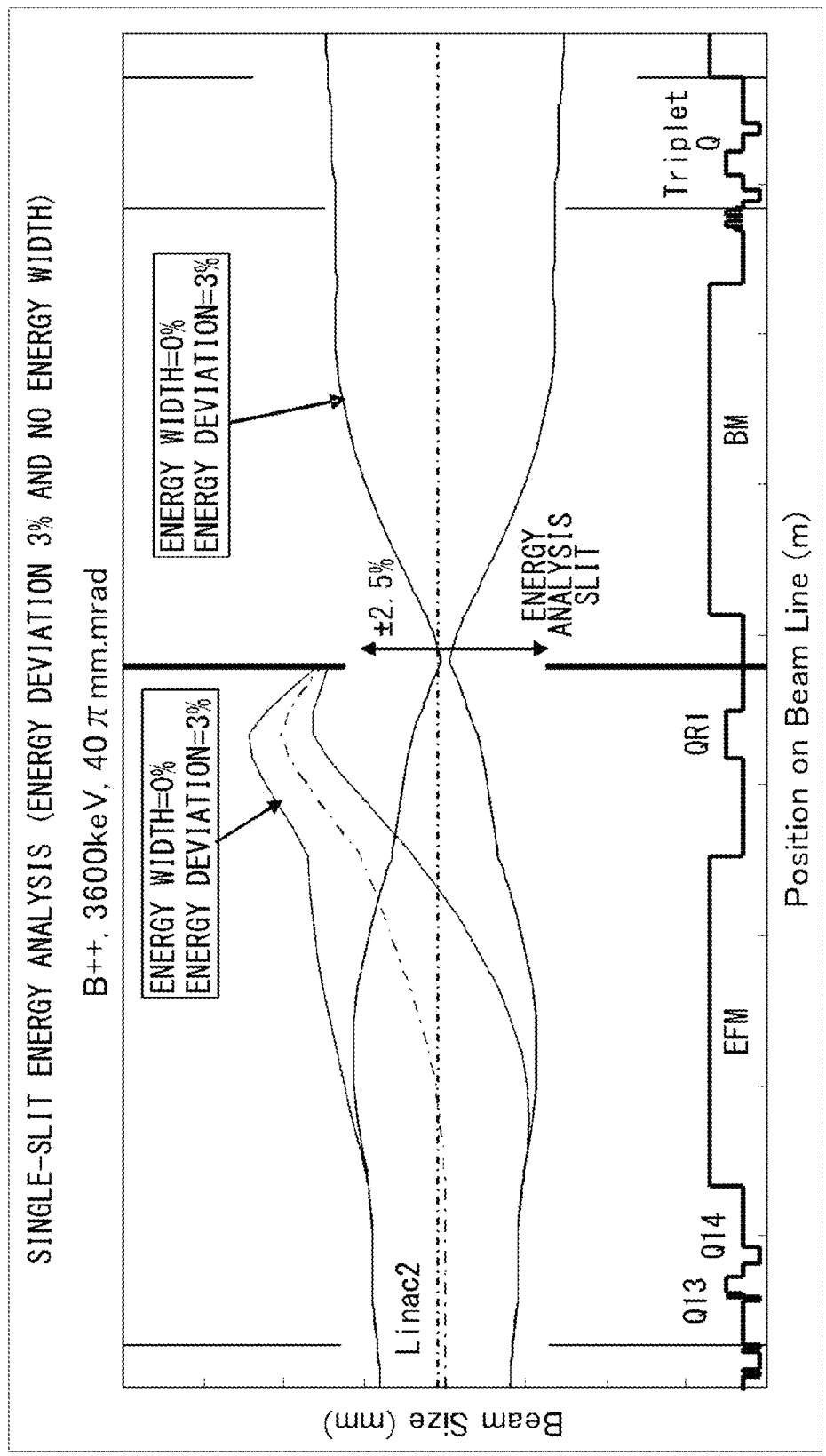
FIG. 27 is a schematic view illustrating the appearance of a beam having an energy spread of 3% and a center energy deviation of 0% passing through an energy spread confining slit and an energy analysis slit.

FIG. 27 is a schematic view illustrating the appearance of a beam having an energy spread of 0% and a center energy deviation of 3% passing through the energy spread confining slit and the energy analysis slit. As illustrated in FIG. 27, in the energy analysis of a beam (for example, 90 keV±0.000 in the case of set acceleration energy of 90 keV) having no energy spread, a beam (for example, 92.7 keV in a case where the center energy deviation is +3%) having a center energy deviation that is defined as the opening width of the energy analysis slit or more is completely excluded. In such a case, by simply decreasing the opening width of the slit, the energy precision can be raised.

Even for a beam (for example, in a case where the set acceleration energy is 3 MeV, and the energy spread is ±3%, the distribution range is 2.91 MeV to 3.09 MeV) having an energy spread, by narrowing the energy analysis slit, while the energy precision is raised, however, most of the beam is wasted, and the value of the beam current that can be used is markedly lowered, whereby the production capability markedly lowered.

Thus, a technology for decreasing the center energy deviation (shift) with the slit width of the energy analysis slit being maintained to be large is required. As described above, this can be realized by inserting the energy spread confining slit at a position at which the beam width derived from the emittance is not negligibly large with respect to the beam width derived from the energy dispersion.

Figure 28:
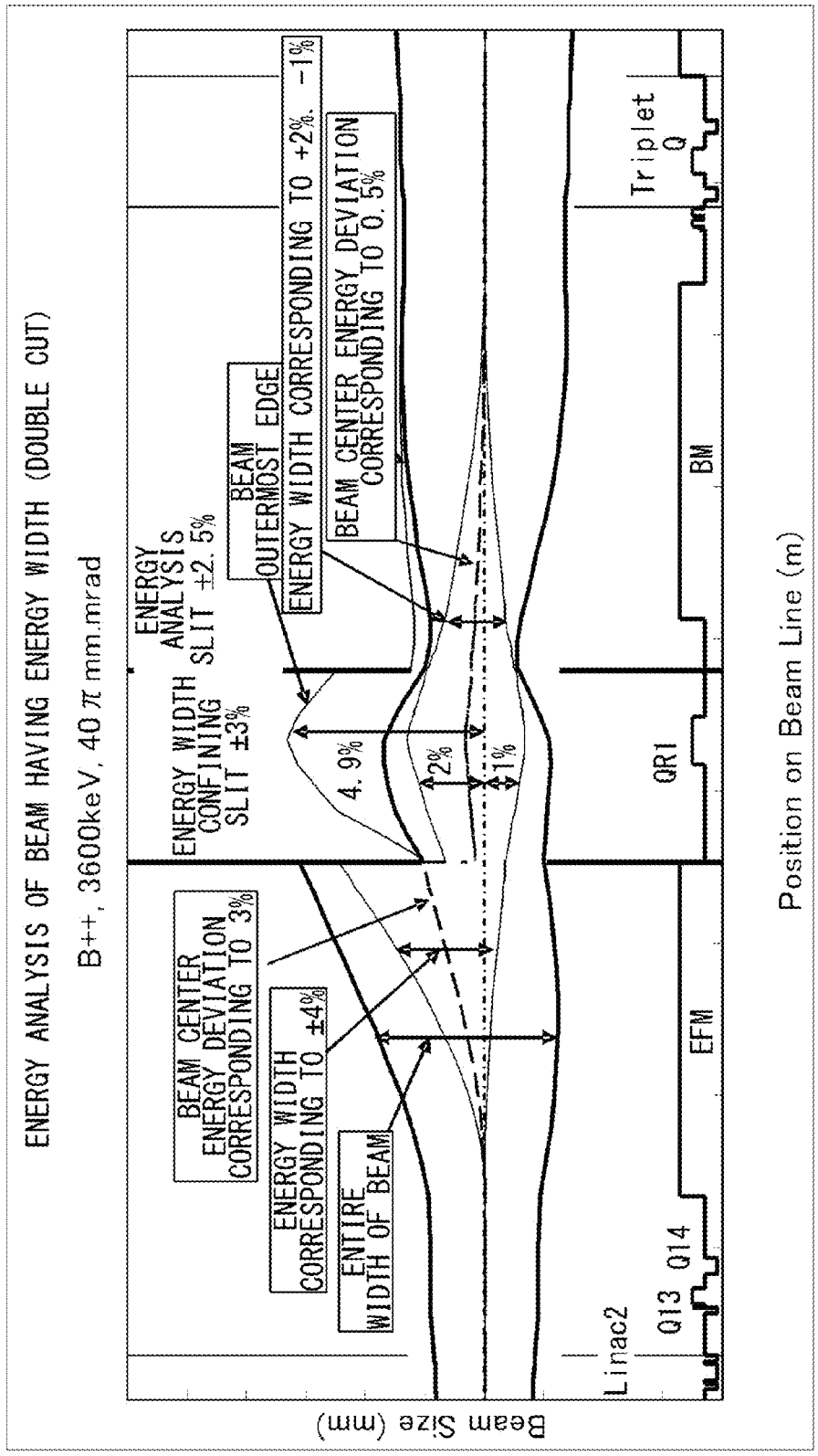
FIG. 28 is a schematic view illustrating the appearance of shaping a beam having an energy spread of ±4% and a center energy deviation of +3%.
Figure 29:
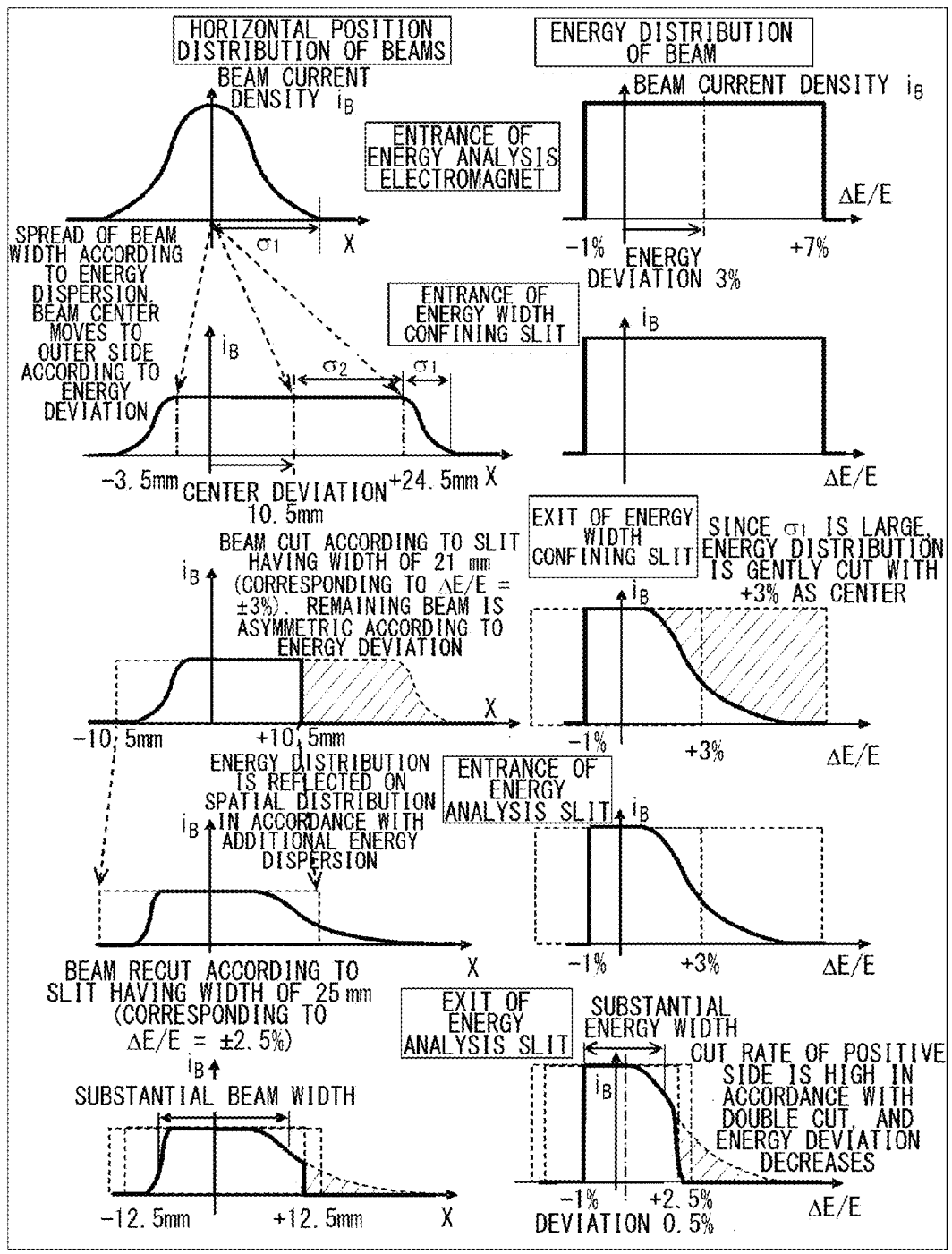
FIG. 29 is a diagram illustrating energy distributions corresponding to horizontal spatial distributions of beams at the entrance of the energy analysis electromagnet (EFM) illustrated in FIG. 28, the entrance and the exit of the energy spread confining slit, and the entrance and the exit of the energy analysis slit.

FIG. 28 is a schematic view illustrating the appearance of shaping a beam having an energy spread of ±4% and a center energy deviation of +3%. FIG. 29 is a diagram illustrating energy distributions corresponding to horizontal spatial distributions of beams at the entrance of the energy analysis electromagnet (EFM) illustrated in FIG. 28 and the entrance and the exit of the energy analysis slit.

As illustrated in FIGS. 28 and 29, the appearance of shaping the beam of an energy spread of ±4% and a center energy deviation of +3% is illustrated. When the energy spread confining slit having a slit width corresponding to an energy spread of ±3% is attached near the exit of the EFM, the allowed energy range is −1% to +3% of the predetermined implantation energy.

In such a case, when the width of the energy analysis slit corresponds to ±1% or more, ions (−1% to 0%) having energy lower than the predetermined implantation energy pass through both the two slits. Accordingly, the energy distribution also has the original shape on the negative side, and, in the case of a rectangular distribution, the rectangular distribution is arrived at a wafer as it is.

For ions having energy higher than the predetermined implantation energy, the energy distribution is shaped to be completely the same as that shaped by the double slit of a case where there is the above-described energy spread, and there is no center energy deviation. Since the rectangular energy distribution is shaped into a (semi) bell-shaped distribution, the center of the distribution moves more to the side of the origin than that of the case of the rectangular distribution. In other words, the energy center of the beam after passing through the energy analysis slit is further close to the predetermined implantation energy. For example, when the width of the energy analysis slit is set to be in correspondence with an energy spread of ±2.5%, the center energy deviation that is originally 3% becomes 0.5% or less.

In a case where the original energy distribution is closer to a distribution of the Gaussian distribution than to a rectangular (uniform) distribution, the effect of correcting the energy center using the energy spread confining slit becomes higher.

In this way, in order to increase the energy precision by reducing one or both of the energy spread and the energy center deviation of a beam accelerated by an acceleration system that has an energy spread (energy distribution) of about a maximum of several % with respect to the set beam energy and a possibility of the center energy deviation, energy definition using a double slit installed at a position at which the beam size derived from the energy dispersion and the beam size derived from the emittance are appropriately controlled is effective.

As an operating method of the energy analysis electromagnet used for excluding ions having shifted energy, a method is employed in which a magnetic field is fixed to a value corresponding to a specific energy. Between the magnetic field (magnetic flux density) B [T] of the analysis electromagnet and the energy E [keV] of an ion, the following strict relation is formed.

Equation (6)

$$E = 4.824265 \times 10^4 \times (B^2 \cdot r^2 \cdot n^2)/m \quad (6)$$

Here, m [amu] is a mass number of the ion, n is an electronic charge state of the ion, and r [m] is the radius of curvature of the beam center orbit inside the electromagnet (this is called the radius of curvature of the deflection electromagnet). Among these, m and n are fixed values determined based on the implantation condition, and r is a fixed value determined at the time of designing the electromagnet. Accordingly, operating the magnetic field B to be fixed means specifying the ion energy E.

By installing the energy spread confining slit and the energy analysis slit so that only ions passing near the center of the magnet pole can pass, only ions having a specific energy passes through the analysis slit. On the other hand, ions having energy deviating from the reference value by a constant value or more collide with the wall of this slit so as to be excluded from the beamline.

In a case where the energy of the original beam slightly deviates (shifted), and the beam current is insufficient, the energy is corrected by finely adjusting the acceleration phase or the acceleration voltage of the linear accelerator, thereby increasing the beam current. In order to adjust the beam current (beam center orbit position), the magnet field of the energy analysis electromagnet does not need to be finely adjusted.

The deflection electromagnet used as the energy analysis electromagnet has an important role of determining the implantation energy of the ion beam based on the value of the magnetic field. Accordingly, the magnetic field needs to be precisely set and be uniformly distributed. This is realized by producing the electromagnet having a pole face parallelization degree of ±50 μm and suppressing the magnetic field non-uniformity to be ±0.01% or less.

In this way, by arranging the energy analysis electromagnet, the energy spread confining slit, and the energy analysis slit, high energy precision can be secured for a beam, which has an energy spread, accelerated by the linear accelerator.

In addition, here, while a case has been described in which the deflection unit is configured by two electromagnets, also in a case where there are more deflection electromagnets or in a case where another focusing element such as an electrostatic Q lens, a Q lens (quadrupole electromagnet), or a pole face angle of the deflection electromagnet is inserted into the deflection unit, a high-precision energy analysis can be performed using the same technique.

Hereinafter, an example of the high-energy ion implanter that is a high-frequency acceleration type ion acceleration and transportation apparatus having high energy precision according to this embodiment will be described in detail. First, the details of devising of the present invention that is performed by the inventors of this application will be described.

(Parallel Magnet)

The following problems arise in a high-energy ion implanter of the related art that employs a parallel (collimate) magnet which parallelizes (collimates) an orbit by a deflection magnetic field.

When a high-energy ion is implanted into a photoresist attachment wafer, a large amount of an outgas is generated. Then, an interaction occurs between molecules of the outgas and beam ions, and hence the charge state of some ions change. When a change in valance occurs while the beam passes through the parallel magnet, a deflection angle changes and the parallelism of the beam is collapsed. Accordingly, an implantation angle with respect to the wafer is not uniform.

Further, the amount (the number or the dose) of the implanted ions may be obtained by measuring a beam current in a faraday cup disposed near the wafer. However, the measurement value is influenced due to a change in charge state, and hence the measurement value is deviated from a predetermined implantation dose. As a result, the expected characteristics of a semiconductor device may not be obtained according to the design.

Further, in the parallelism of one parallel magnet, the inner and outer orbits have different deflection angles and different orbit lengths. For this reason, the ratio of the ions subjected to a change in charge state increases as it goes toward the outer orbit, and hence the dose uniformity inside the wafer surface is also degraded.

Thus, a recent demand for highly precise implantation may not be sufficiently handled by the beam transportation type of the high-energy ion implanter of the related art.

Further, the parallel magnet needs a wide magnetic pole in the scan direction and a parallelizing section having a certain length. Since the length and the size of the magnetic pole increase when the energy increases, the weight of the parallel magnet considerably increases. In order to stably fix and hold the apparatus, the design for the strength of the semiconductor factory needs to be reinforced, and the power consumption considerably increases.

These problems may be solved when the electric field parallelizing lens and the electrostatic (the electrode type) energy filter (AEF: Angular Energy Filter) used in the above-described medium current ion implanter may be used in the high-energy region. The electrostatic parallelizing lens aligns and collimates the scan orbit to the center orbit while keeping the symmetry of the orbit, and the AEF removes the ions subjected to a change in charge state directly before the wafer. Accordingly, even when a large amount of the outgas exists, a beam without an energy contamination may be obtained, and hence the implantation angle in the scan direction does not become non-uniform as in the case of the parallel magnet. As a result, the ions may be implanted with an accurate implantation distribution in the depth direction and a uniform implantation dose, and the implantation angle also becomes uniform, thereby realizing a highly precise ion implantation. Further, since the light-weight electrode member is used, the power consumption may be decreased compared to the electromagnet.

The point of the invention is to obtain an apparatus capable of performing the same highly precise implantation as that of the medium current apparatus in the high-energy apparatus by introducing an excellent system of the medium current ion implanter into the high-energy ion implanter. The problems to be solved in this trial will be described below. The first problem is the length of the apparatus.

In a case where the ion beams are deflected at the same trajectory, the necessary magnetic field is proportional to the square root of the energy, and the necessary electric field is proportional to the energy. Thus, the length of the deflection magnetic pole is proportional to the square root of the energy, and the length of the deflection electrode is proportional to the energy. When the highly precise angle implantation is tried by mounting the electrostatic parallelizing lens and the electrostatic AEF onto the high-energy ion implanter, the beam transportation system (the distance from the scanner to the wafer) largely increases in length compared to the apparatus of the related art that uses the parallel magnet.

For example, as the high-energy ion implanter that includes a parallelization mechanism using such an electric field, a structure is considered which is obtained by substantially linearly fixing constituents such as an ion source, a mass analysis magnet, a tandem type electrostatic accelerator or a radio frequency linear accelerator, a beam scanner, a scan orbit beam collimator, an energy filter, an implantation process chamber, and a substrate transportation unit (an end station) as in the case of the high-energy ion implanter of the related art. In this case, the entire length of the apparatus increase by about 20 m compared to the apparatus of the related art having a length of about 8 m. Accordingly, it takes large effort when the installation place is set and prepared and the installation operation is performed, and then the installation area also increases. Further, a work space is also needed for the alignment adjustment of the devices and the maintenance, the repair, or the adjustment thereof after the operation of the apparatus. Such a large ion implanter may not satisfy a demand for adjusting the size of the apparatus in the semiconductor production line to the actual size of the apparatus arranged in the factory production line.

In view of such circumstances, an object of the beamline structure in the aspect of the invention is to provide a highly precise high-energy ion implanter with an electrostatic parallelizing lens and an electrostatic energy filter by simplifying and efficiently adjusting an installation place setting and preparing work, an installation work, or a maintenance work while ensuring a sufficient work area and realizing a technique of suppressing an increase in installation area.

("U"-Shaped Folded Beamline)

The object may be attained by a configuration in which the beamline of the high-energy ion implanter includes a long line portion that is formed by a plurality of units for accelerating an ion beam generated by an ion source and a long line portion that is formed by a plurality of units for adjusting and implanting a scanned beam into a wafer and a horizontal U-shaped folded beamline having the long line portions facing each other is formed. Such a layout is realized by substantially matching the length of the beam transportation unit including a beam scanner, a beam collimator, an energy filter, and the like to the length of the unit accelerating the ions from the ion source. Then, a sufficiently wide space is provided between two long line portions for the maintenance work.

An aspect of the invention is supposed based on the layout of the beamline, and an object thereof is to provide a high-energy ion implanter capable of scanning a high-energy ion beam in a range sufficiently wider than a wafer size, instantly stopping a transportation in the event of a beam transportation failure, and normally maintaining a highly precise implantation state by scanning a high-energy beam with satisfactory responsiveness.

A high-energy ion implanter according to an aspect of the invention is a high-energy ion implanter that accelerates ions generated by an ion source so as to generate an ion beam, transports the ion beam to a wafer along a beamline, and implants the ion beam into a wafer, and includes: a beam generation unit that includes an ion source and a mass analyzer; a high-energy multi-stage linear acceleration unit that accelerates an ion beam so as to generate a high-energy ion beam; a high-energy beam deflection unit that changes the direction of the high-energy ion beam toward the wafer; a beam transportation unit that transports the deflected high-energy ion beam to the wafer; and a substrate processing/supplying unit that uniformly implants the transported high-energy ion beam into the semiconductor wafer. The beam transportation unit includes a beam focusing/defocusing unit, a beam scanner for high-energy beam, an electrostatic beam collimator for high-energy beam, and an electrostatic final energy filter for high-energy beam. Then, the high-energy ion beam emitted from the deflection unit is scanned and collimated by the beam scanner and the electrostatic beam collimator, mixed ions having a different mass, a different ion charge state, and different energy are removed by the electrostatic final energy filter for high-energy beam, and the resultant ions are implanted into the wafer.

In this configuration, the high-energy beam scanner is configured as an electrostatic beam scanner that is operated with a finely adjustable triangular wave. Since the electrostatic having fast responsiveness is employed, a discharge of the electrode or the like occurs during the ion implantation, and hence the beam becomes instable. Since the electrostatic beam scanner having fast responsiveness is employed, in a case where the non-uniformity of the implantation amount is predicted, a system may be obtained which instantly stops the implantation and immediately resumes the implantation in a stabilized state. Thus, the implantation precision may be ensured in any case. Further, since the operation frequency may be easily changed, the amount of the crystal defect occurring in the silicon crystals during the ion implantation may be controlled, and hence the quality of the product may be improved.

The electrostatic beam scanner includes a pair of deflection electrodes, but an excessively high voltage may not be applied to the electrodes for the fast responsiveness. However, in order to perform the highly precise implantation that keeps the implantation dose non-uniformity of the entire wafer surface at 0.5% or less, the scan range needs to be sufficiently wider than the wafer size. For this reason, the beam scanner needs to have a sufficient deflection angle with respect to the high-energy beam. Therefore, in the invention, a sufficient deflection angle is obtained in a manner such that a relation of $L_1 \geq 5D_1$ is satisfied when the gap between the pair of deflection electrodes is indicated by $D_1$ and the length thereof in the beam traveling direction is indicated by $L_1$.

According to the aspect of the invention, the high-energy ion beam may be scanned in a range sufficiently wider than the wafer size, and hence the highly precise implantation in which the implantation dose non-uniformity of the entire wafer surface is suppressed to 0.5% or less may be performed. Further, when a problem such as the discharge of the electrode occurs due to the transportation of the beam, the high-energy beam scanning operation having satisfactory responsiveness and instantly stopping the ion implantation may be performed. Accordingly, the highly precise implantation may be maintained.

Therefore, the high-energy ion implanter that is an ion acceleration and transportation apparatus according to the aspect of the embodiment is an ion implanter that accelerates the ions generated by the ion source, transports the ions as the ion beam along the beamline to the wafer, and implants the ions into the wafer. This apparatus includes the high-energy multi-stage linear acceleration unit that accelerates the ion beam so as to generate the high-energy ion beam, the deflection unit that bends the orbit of the high-energy ion beam in a U-shape, and the beam transportation unit that transports the analyzed high-energy ion beam to the wafer, and the collimated ion beam is highly precisely irradiated to the wafer moving in a mechanical scan state so as to be implanted into the wafer.

The high-energy ion beam that is emitted from the radio frequency (AC-type) high-energy multi-stage linear acceleration unit for highly accelerating the ion beam includes a certain range of energy distribution. For this reason, in order to scan and collimate the high-energy ion beam of the rear stage and irradiate the high-energy ion beam to the wafer moving in a mechanical scan state, there is a need to perform the highly precise energy analysis, the center orbit correction, and the beam convergence and divergence adjustment in advance.

The beam deflection unit includes at least two highly precise deflection electromagnets, at least one energy spread confining slit, an energy analysis slit, and at least one horizontal focusing unit. The plurality of deflection electromagnets are formed so as to perform the energy analysis of the high-energy ion beam, the precise correction of the ion implantation angle, and the suppression of the energy dispersion. In the highly precise deflection electromagnets, a nuclear magnetic resonance probe and a hall probe are attached to the electromagnet for the energy analysis, and only the hall probe is attached to the other electromagnet. The nuclear magnetic resonance probe is used to calibrate the hall probe, and the hall probe is used for the uniform magnetic field feedback control.

The beam transportation unit may implant ions by scanning and parallelizing the high-energy ion beam and highly precisely irradiating the high-energy ion beam to the wafer moving in a mechanical scan state.

Hereinafter, an example of the high-energy ion implanter according to the embodiment will be described in more detail with reference to the drawings. Furthermore, the same reference numerals will be given to the same components in the description of the drawings, and the repetitive description of the same components will be appropriately omitted. Further, the configuration mentioned below is merely an example, and does not limit the scope of the invention.

(High-Energy Ion implanter)

First, a configuration of the high-energy ion implanter according to the embodiment will be simply described. Furthermore, the content of the specification may be applied to not only the ion beam as one of kinds of charged particles, but also the apparatus involved with the charged particle beam.

FIG. 1 is a schematic view illustrating a schematic layout and a beamline of a high-energy ion implanter 100 according to the embodiment.

The high-energy ion implanter 100 according to the embodiment is an ion implanter that includes a radio frequency linear acceleration type ion accelerator and a high-energy ion transportation beamline, and is configured to accelerate ions generated by an ion source 10, transports the ions along the beamline to a wafer (a substrate) 200 as an ion beam, and implants the ions into a wafer 200.

As illustrated in FIG. 1, the high-energy ion implanter 100 includes an ion beam generation unit 12 that generates ions and separates the ions by mass, a high-energy multi-stage linear acceleration unit 14 that accelerates an ion beam so as to become a high-energy ion beam, a beam deflection unit 16 that performs an energy analysis, a center orbit correction, and an energy dispersion control on the high-energy ion beam, a beam transportation unit 18 that transports the analyzed high-energy ion beam to a wafer, and a substrate processing/supplying unit 20 that uniformly implant the transported high-energy ion beam into the semiconductor wafer.

The ion beam generation unit 12 includes the ion source 10, an extraction electrode 40, and a mass analyzer 22. In the ion beam generation unit 12, a beam is extracted from the ion source 10 through the extraction electrode and is accelerated, and the extracted and accelerated beam is subjected to a mass analysis by the mass analyzer 22. The mass analyzer 22 includes a mass analysis magnet 22a and a mass analysis slit 22b. There is a case in which the mass analysis slit 22b is disposed directly behind the mass analysis magnet 22a. However, in the embodiment, the mass analysis slit is disposed inside the entrance of the high-energy multi-stage linear acceleration unit 14 as the next configuration.

Only the ions necessary for the implantation are selected as a result of the mass analysis using the mass analyzer 22, and the ion beam of the selected ions is led to the next high-energy multi-stage linear acceleration unit 14. The direction of the ion beam that is further accelerated by the high-energy multi-stage linear acceleration unit 14 is changed by the beam deflection unit 16.

The beam deflection unit 16 includes an energy analysis electromagnet 24, a horizontal focusing quadrupole lens 26 that suppresses an energy dispersion, an energy spread confining slit 27 (see FIGS. 5A and 5B below), an energy analysis slit 28, and a deflection electromagnet 30 having a steering function. Furthermore, the energy analysis electromagnet 24 may be called an energy filter electromagnet (EFM). The direction of the high-energy ion beam is changed by the deflection unit so as to be directed toward the substrate wafer.

The beam transportation unit 18 is used to transport the ion beam emitted from the beam deflection unit 16, and includes a beam focusing/defocusing unit 32 formed by a convergence/divergence lens group, a beam scanner 34, a beam collimator 36, and a final energy filter 38 (with a final energy separation slit). The length of the beam transportation unit 18 is designed so as to match the lengths of the ion beam generation unit 12 and the high-energy multi-stage linear acceleration unit 14, and the beam transportation unit 18 is connected to the deflection unit so as to form a U-shaped layout as a whole.

The substrate processing/supplying unit 20 is provided at the termination end of the downstream side of the beam transportation unit 18, and the implantation process chamber accommodates a beam monitor that measures the beam current, the position, the implantation angle, the convergence and divergence angle, the vertical and horizontal ion distribution, and the like of the ion beam, a charge prevention device that prevents the charge of the substrate by the ion beam, a wafer transportation mechanism that carries the wafer (the substrate) 200 and installs the wafer at an appropriate position and an appropriate angle, an ESC(Electro Static Chuck) that holds the wafer during the ion implantation, and a wafer scan mechanism that operates the wafer in a direction perpendicular to the beam scan direction at the velocity in response to a change in the implantation beam current.

In this way, the high-energy ion implanter 100 that is formed by arranging the units in a U-shape ensures satisfactory workability while suppressing an increase in foot print. Further, in the high-energy ion implanter 100, the units or the devices are formed as a module, and hence may be attached, detached, and assembled in accordance with the beamline reference position.

Next, the units and the devices constituting the high-energy ion implanter 100 will be described further in detail.

(Ion Beam Generation Unit)

Figure 2A:
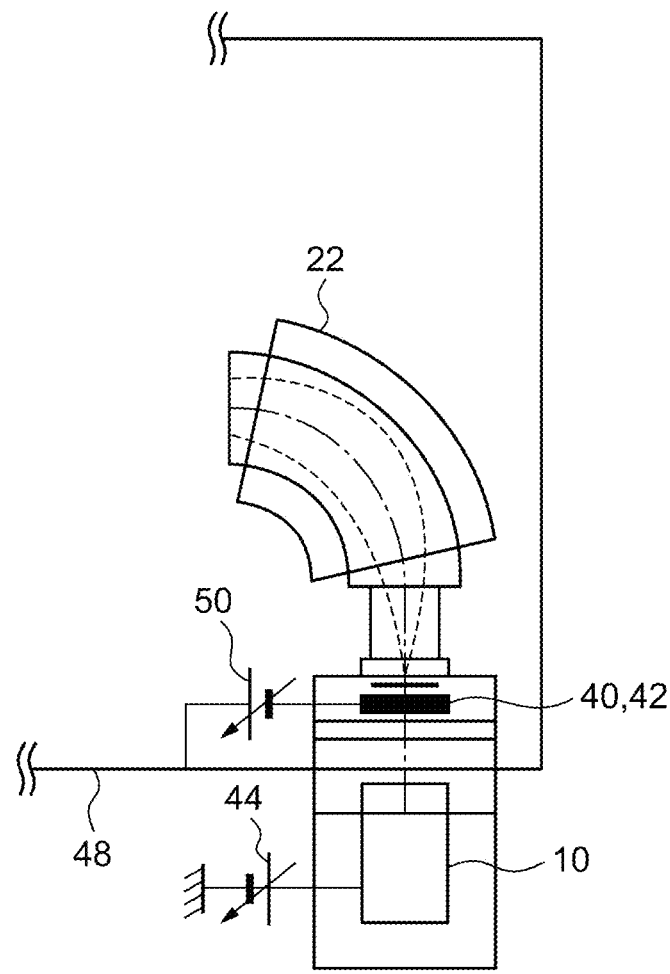
FIG. 2A is a top view illustrating a schematic configuration of an ion beam generation unit.
Figure 2B:
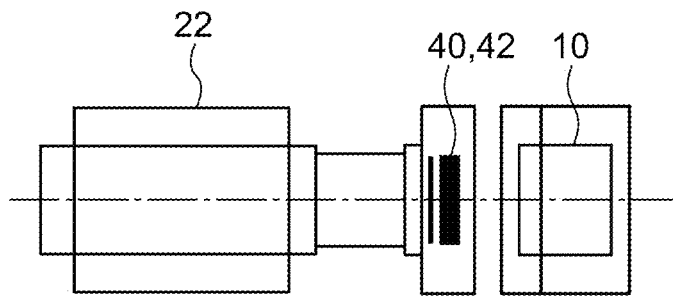
FIG. 2B is a side view illustrating the schematic configuration of the ion beam generation unit.

FIG. 2A is a top view illustrating a schematic configuration of the ion beam generation unit, and FIG. 2B is a side view illustrating a schematic configuration of the ion beam generation unit.

As illustrated in FIGS. 2A and 2B, the extraction electrode 40 that extracts an ion beam from plasma generated inside an ion chamber (an arc chamber) is provided at the exit of the ion source 10 disposed at the most upstream side of the beamline. An extraction suppression electrode 42 that suppresses electrons included in the ion beam extracted from the extraction electrode 40 from reversely flowing toward the extraction electrode 40 is provided near the downstream side of the extraction electrode 40.

The ion source 10 is connected to an ion source high-voltage power supply 44. An extraction power supply 50 is connected between the extraction electrode 40 and a terminal 48. The downstream side of the extraction electrode 40 is provided with the mass analyzer 22 that separates predetermined ions from the incident ion beam and extracts the separated ion beam.

Figure 5A:
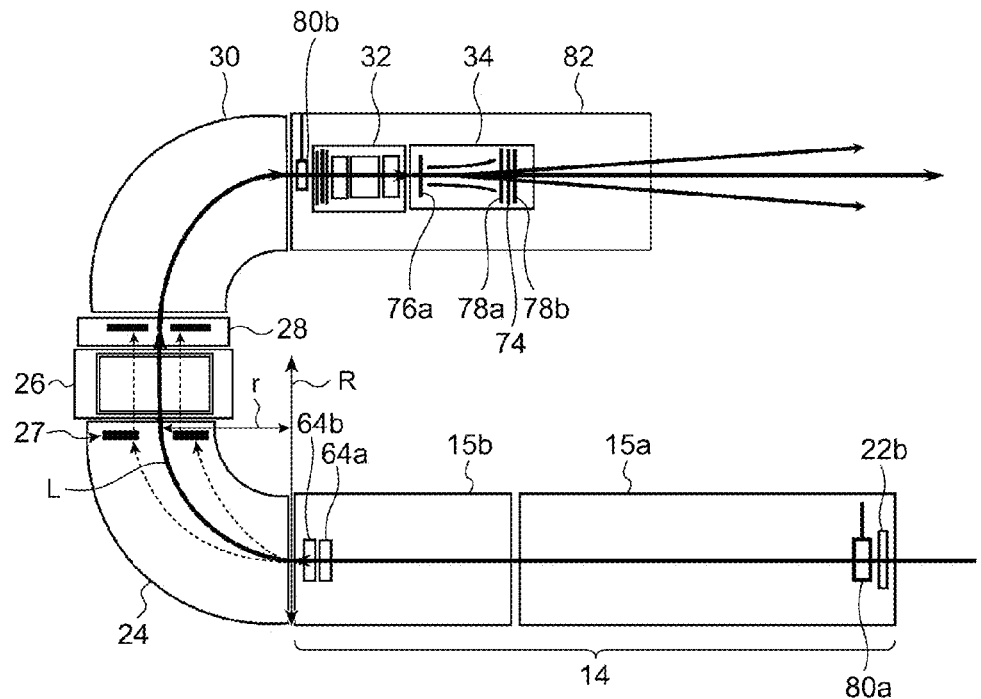
FIGS. 5A and 5B are top views illustrating a schematic configuration of an EFM (an energy analyzing deflection electromagnet), an energy spread confining slit, an energy analysis slit, a BM (a lateral center orbit correcting deflection electromagnet), a beam focusing/defocusing unit, and a beam scanner (a scanner)
Figure 5B:
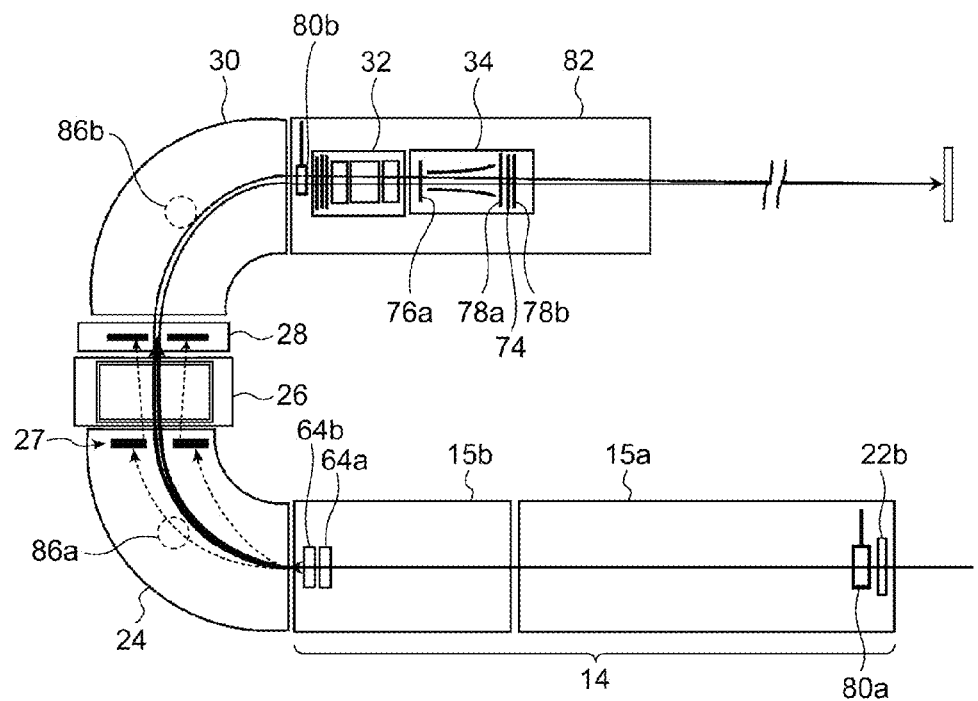

As illustrated in FIGS. 5A and 5B to be described below, a faraday cup (for an injector) 80*a* that measures the total beam current of the ion beam is disposed at the foremost portion inside the linear acceleration portion housing of the high-energy multi-stage linear acceleration unit 14.

Figure 14A:
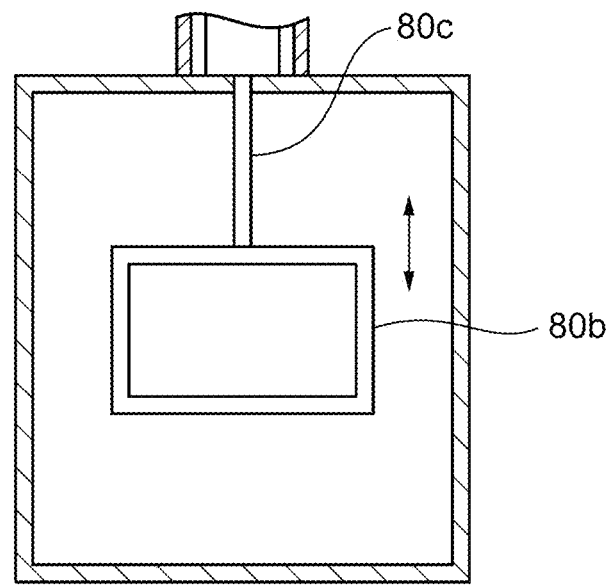
FIG. 14A is a schematic front view illustrating a resolver-faraday cup having substantially the same configuration as that of an injector faraday cup.
Figure 14B:
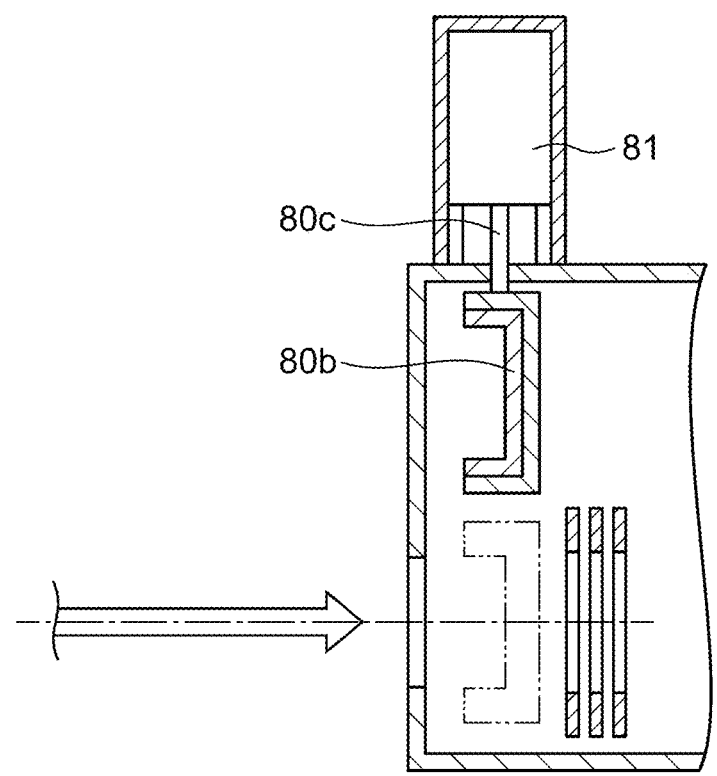
FIG. 14B is also a schematic view illustrating an operation of the resolver-faraday cup.

FIG. 14A is a schematic front view illustrating a resolver-faraday cup 80*b* having substantially the same configuration as that of the injector faraday cup 80*a*, and FIG. 14B is also a schematic view illustrating an operation of the resolver-faraday cup 80*b*.

The injector faraday cup 80*a* may be extracted from the vertical direction on the beamline by a driving mechanism, and is formed so that an opening faces the upstream side of the beamline while having a rectangular square shape in the horizontal direction. Accordingly, the injector faraday cup is used to completely interrupt the ion beam reaching the downstream side of the beamline on the beamline if necessary other than the function of measuring the total beam current of the ion beam during the adjustment of the ion source or the mass analysis electromagnet. Further, as described above, the mass analysis slit 22*b* is disposed inside the entrance of the high-energy multi-stage linear acceleration unit 14 directly before the injector faraday cup 80*a*. Further, the width of the slit may be constant or variable. If the width of the slit is variable, the width may be adjusted in accordance with ion mass. The varying method of the width may be continuous, stepwise or switching a plurality of slits having different widths.

(High-Energy Multi-Stage Linear Acceleration Unit)

Figure 3:
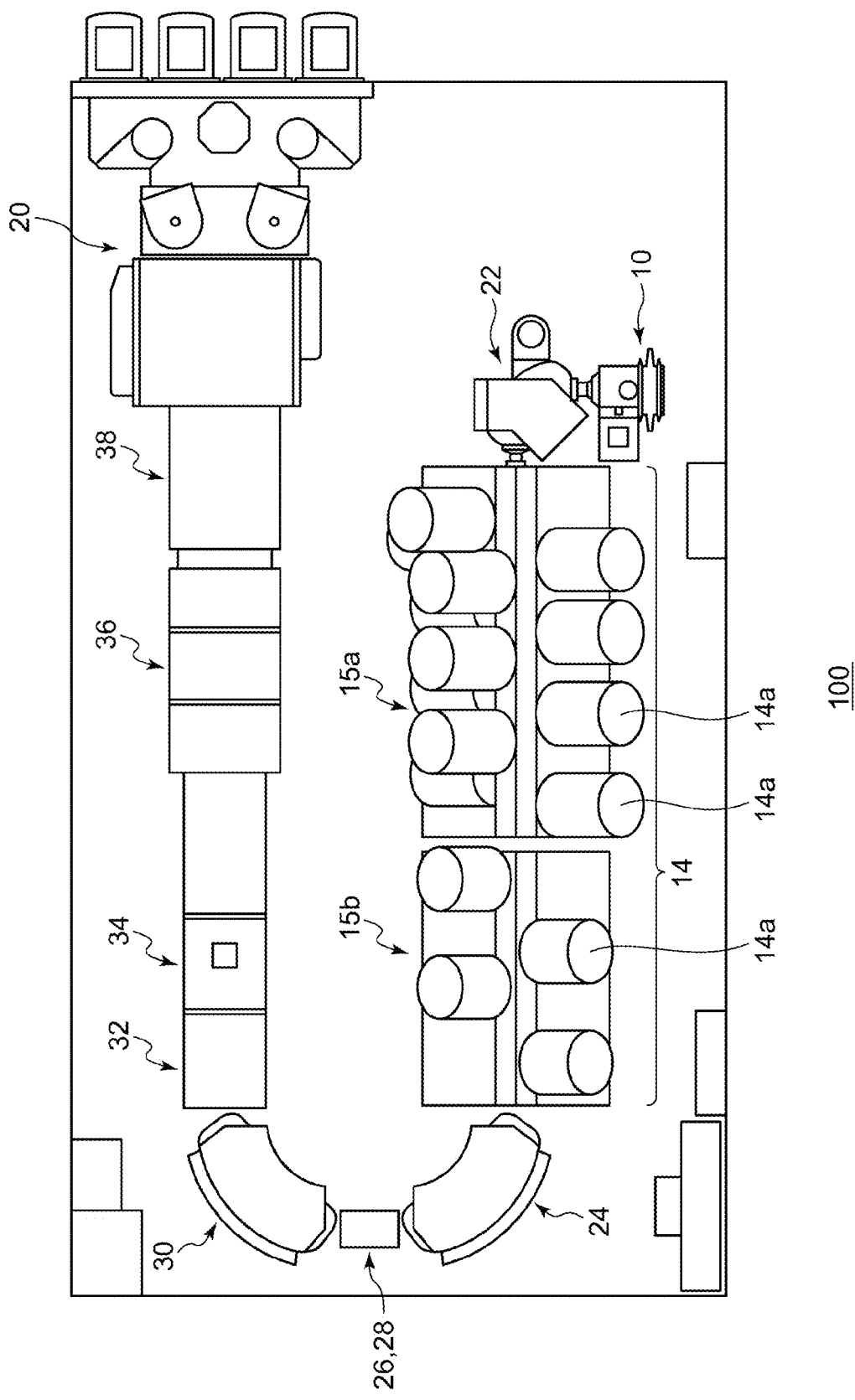
FIG. 3 is a top view illustrating an entire layout including a schematic configuration of a high-energy multi-stage linear acceleration unit.

FIG. 3 is a top view illustrating the entire layout including the schematic configuration of the high-energy multi-stage linear acceleration unit 14. The high-energy multi-stage linear acceleration unit 14 includes a plurality of linear accelerators for accelerating the ion beam, that is, an acceleration gap that interposes one or more radio frequency resonators 14*a*. The high-energy multi-stage linear acceleration unit 14 may accelerate the ions by the action of the radio frequency (RF) electric field. In FIG. 3, the high-energy multi-stage linear acceleration unit 14 includes a first linear accelerator 15*a* that includes a basic multi-stage radio frequency resonator 14*a* for a high-energy ion implantation and a second linear accelerator 15*b* that includes an additional multi-stage radio frequency resonator 14*a* for a super-high-energy ion implantation.

Meanwhile, in the ion implanter that uses the acceleration of the radio frequency (RF), the amplitude V [kV] and the frequency f [Hz] of the voltage need to be considered as the parameter of the radio frequency. Further, in a case where a multi-stage radio frequency acceleration is performed, the phase φ [deg] of the radio frequency is added as the parameter. In addition, a magnetic field lens (for example, a quadrupole electromagnet) or an electrostatic lens (for example, an electrostatic quadrupole electrode) is needed so as to control the expansion of the ion beam in the vertical and horizontal directions during or after the acceleration by the convergence and divergence effect. Then, the optimal values of these operation parameters are changed by the ion energy passing therethrough, and the strength of the acceleration electric field influences the convergence and divergence action. For this reason, these values are determined after the parameter of the radio frequency is determined.

Figure 4:
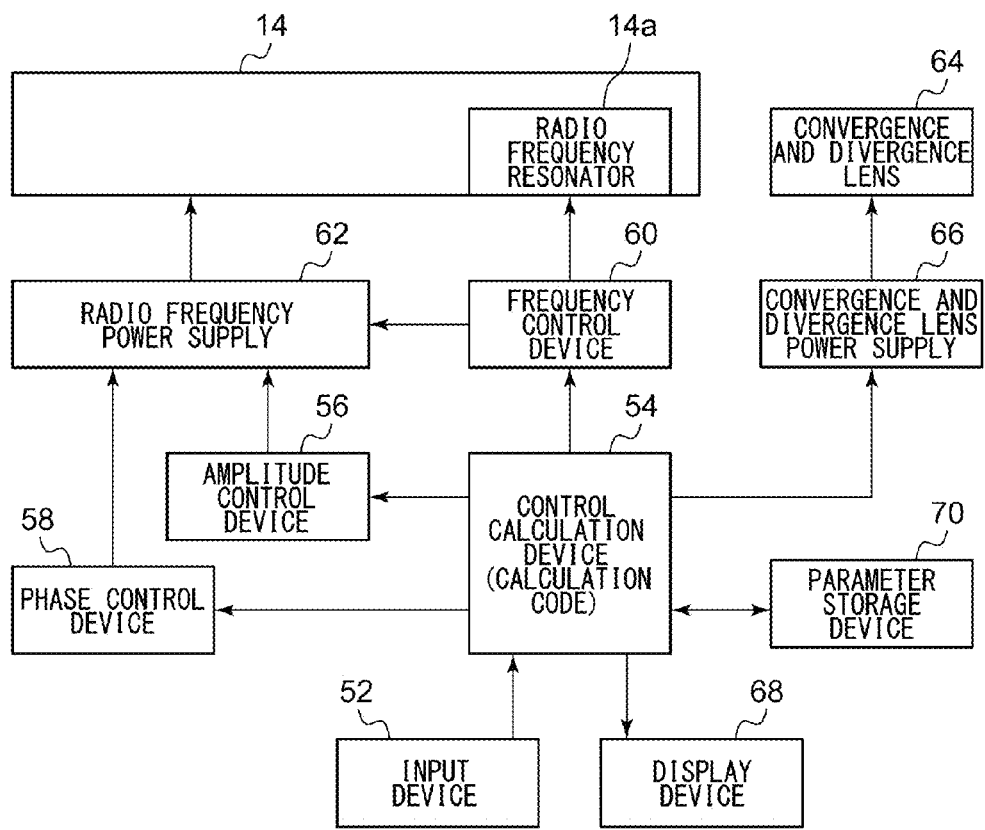
FIG. 4 is a block diagram illustrating a configuration of a control system of a convergence and divergence lens and the high-energy multi-stage linear acceleration unit obtained by linearly arranging acceleration electric fields (gaps) of front ends of a plurality of radio frequency resonators.

FIG. 4 is a block diagram illustrating a configuration of a control system of the convergence and divergence lens and the high-energy multi-stage linear acceleration unit obtained by linearly arranging the acceleration electric fields (the gaps) at the front ends of the plurality of radio frequency resonators.

The high-energy multi-stage linear acceleration unit 14 includes one or more radio frequency resonators 14a. As the components necessary for the control of the high-energy multi-stage linear acceleration unit 14, an input device 52 for allowing an operator to input a necessary condition, a control calculation device 54 that numerically calculates various parameters from the input condition and controls the components, an amplitude control device 56 that adjusts the voltage amplitude of the radio frequency, a phase control device 58 that adjusts the phase of the radio frequency, a frequency control device 60 that controls the frequency of the radio frequency, a radio frequency power supply 62, a convergence and divergence lens power supply 66 for a convergence and divergence lens 64, a display device 68 that displays an operation parameter thereon, and a storage device 70 that stores the determined parameter are needed. Further, the control calculation device 54 stores therein a numerical calculation code (a program) for numerically calculating various parameter in advance.

In the control calculation device 54 of the radio frequency linear accelerator, radio frequency parameters (an amplitude, a frequency, and a phase of a voltage) are calculated so as to obtain the optimal transportation efficiency by simulating the acceleration, the convergence, and the divergence of the ion beam based on the input condition and the numerical calculation code stored therein. Also, the parameter (a Q coil current or a Q electrode voltage) of the convergence and divergence lens 64 that is used to efficiently transport the ion beam is also calculated. The calculated various parameters are displayed on the display device 68. The display device 68 displays a non-answerable mark for the acceleration condition that exceeds the ability of the high-energy multi-stage linear acceleration unit 14.

The voltage amplitude parameter is transmitted from the control calculation device 54 to the amplitude control device 56, and the amplitude control device 56 adjusts the amplitude of the radio frequency power supply 62. The phase parameter is transmitted to the phase control device 58, and the phase control device 58 adjusts the phase of the radio frequency power supply 62. The frequency parameter is transmitted to the frequency control device 60. The frequency control device 60 controls the output frequency of the radio frequency power supply 62, and controls the resonance frequency of the radio frequency resonator 14a of the high-energy multi-stage linear acceleration unit 14. Further, the control calculation device 54 controls the convergence and divergence lens power supply 66 by the calculated convergence and divergence lens parameter.

The convergence and divergence lens 64 that is used to efficiently transport the ion beam is disposed as many as needed at a position inside the radio frequency linear accelerator or a position before and behind the radio frequency linear accelerator. That is, the divergence lens and the convergence lens are alternately provided at the position before and behind the acceleration gap of the front end of the multi-stage radio frequency resonator 14a. At one side thereof, an additional vertical focusing lens 64b (see FIGS. 5A and 5B) is disposed behind the horizontal focusing lens 64a (see FIGS. 5A and 5B) at the termination end of the second linear accelerator 15b, adjusts the convergence and the divergence of the high-energy acceleration ion beam passing through the high-energy multi-stage linear acceleration unit 14, and causes the ion beam having an optimal two-dimensional beam profile to be incident to the beam deflection unit 16 of the rear stage.

In the direction of the electric field generated in the acceleration gap of the radio frequency linear accelerator, the ion acceleration direction and the ion deceleration direction change at every several tens of nano seconds. In order to accelerate the ion beam to the high energy, the electric field needs to be directed in the acceleration direction when the ions enter all acceleration gaps which exist at several tens of places. The ions that are accelerated by a certain acceleration gap need to pass through a space (a drift space) in which the electric field between two acceleration gaps is shielded until the electric field of the next acceleration gap is directed in the acceleration direction. Since the ions are decelerated even at the early timing or the late timing, the ions may not reach the high energy. Further, since it is a very strict condition that the ions are carried along the acceleration phase in all acceleration gaps, the ion beam that reaches the predetermined energy is a resultant obtained from a difficult selection for the mass, the energy, and the charge (factors for determining the velocity) by the radio frequency linear accelerator. In this meaning, the radio frequency linear accelerator is also a good velocity filter.

(Beam Deflection Unit)

As illustrated in FIG. 1, the beam deflection unit 16 includes the energy analysis electromagnet 24 as the energy filter deflection electromagnet (EFM), the energy spread confining slit 27 (see FIGS. 5A and 5B), the energy analysis slit 28, the horizontal focusing quadrupole lens 26 that controls the deflected energy dispersion at the wafer position, and the deflection electromagnet 30 that has an implantation angle correction function.

FIGS. 5A and 5B are top views illustrating a schematic configuration of the EFM (the energy analyzing deflection electromagnet), the energy spread confining slit, the energy analysis slit, the BM (the lateral center orbit correcting deflection electromagnet), the beam focusing/defocusing unit, and the beam scanner (the scanner). Furthermore, the sign L illustrated in FIG. 5A indicates the center orbit of the ion beam.

The ion beam that passes through the high-energy multi-stage linear acceleration unit 14 enables the energy distribution by a synchrotron oscillation. Further, there is a case in which the beam having a center value slightly deviated from the predetermined energy may be emitted from the high-energy multi-stage linear acceleration unit 14 when the acceleration phase adjustment amount is large. Therefore, the magnetic field of the energy filter deflection magnet (EFM) is set so that only the ions having desired energy may pass by the beam deflection unit 16 to be described later, and a part of the beam selectively passes by the energy spread confining slit 27 and the energy analysis slit 28, so that the ion energy is adjusted to the setting value. The energy spread of the passing ion beam may be set in advance by the horizontal opening widths of the energy spread confining slit and the analysis slit. Only the ions passing through the energy analysis slit are led to the beamline of the rear stage, and are implanted into the wafer.

When the ion beam having the energy distribution is incident to the energy filter electromagnet (EFM) of which the magnetic field is controlled to a uniform value by the above-described feedback loop control system, the entire incident ion beam causes the energy dispersion while being deflected along the designed orbit, and the ions within a desired energy spread range pass through the energy spread confining slit 27 provided near the exit of the EFM. At the position, the energy dispersion increases to the maximum value, and the beam size $\sigma_1$ (the beam size in a case where the energy spread is zero) due to the emittance decreases to the minimum value. However, the beam width caused by the energy dispersion becomes larger than the beam width caused by the emittance. In a case where the ion beam in such a state is cut by the slit, the spatial distribution is cut sharply, but the energy distribution has a cut shape rounded by the energy spread corresponding to $2\sigma_1$. In other words, for example, even when the slit width is set to the dimension corresponding to 3% of the energy spread, a part of the ions having an energy difference with respect to the predetermined implantation energy smaller than 3% collide with the wall of the slit so as to disappear, but a part of the ions having an energy difference larger than 3% pass through the slit.

The energy analysis slit is installed at a position where the value of $\sigma_1$ becomes minimal. Since the value of $\sigma_1$ decreases to an ignorable value by the slit width at the position, the energy distribution is also cut sharply like the space distribution. For example, even in a case where the opening width of the energy analysis slit is also set to the dimension (0.03 η) corresponding to 3% of the energy spread, all ions having an energy difference exceeding 3% and passing through the energy spread confining slit are interrupted at the position. As a result, when the beam having a rectangular energy distribution at first passes through two slits, a dome-shaped distribution is formed in which the energy becomes a peak value at 0%, the height decreases by a half at ±3%, and the energy abruptly decreases to zero. Since the number of the ions having a small energy difference relatively increases, the energy spread substantially decreases compared to the case where only one energy analysis slit is provided and the ion beam passes through the slit while having a substantially rectangular energy distribution.

In the double slit system, when the energy of the beam accelerated by the linac is slightly deviated from the predetermined implantation energy by the effect of cutting the end of the energy distribution, there is an effect that the energy center deviation of the passed beam decrease. For example, in a case where the energy center deviation is 3% when the energy spread is ±3%, the positive side of the energy having the dome-shaped distribution in the energy distribution of the ion beam passing through the double slit becomes a half, and hence a difference between an actual energy gravity center and an ideal energy gravity center approximately becomes $\Delta E/E=1\%$. Meanwhile, when the ion beam is cut by the single energy analysis slit, the difference between an actual energy gravity center and an ideal energy gravity center approximately becomes $\Delta E/E=1.5\%$. The effect of rounding the distribution is essentially exhibited in a direction in which the deviation of the energy center is suppressed.

In this way, in order to increase the energy precision by reducing one or both of the energy spread and the energy center deviation of a beam accelerated by an acceleration system that has an energy spread (energy distribution) of about a maximum of several % with respect to the set beam energy and a possibility of the center energy deviation, the energy definition using the double slit is effective.

Since the energy analysis electromagnet needs high magnetic field precision, highly precise measurement devices 86a and 86b for precisely measuring the magnetic field are provided (see FIG. 5B). The measurement devices 86a and 86b use the MRP to calibrate the hall probe and uses the hall probe to control the constant magnetic field feedback control by the appropriate combination of the nuclear magnetic resonance (NMR) probe called the magnetic resonance probe (MRP) and the hall probe. Further, the energy analysis electromagnet is produced by high precision so that the non-uniformity of the magnetic field becomes smaller than 0.01%. Further, each electromagnet is connected with a power supply having current setting precision and current stability of $1\times10^{-4}$ or more and a control device thereof.

Further, the quadrupole lens 26 as the horizontal focusing lens is disposed between the energy analysis slit 28 and the energy analysis electromagnet 24 at the upstream side of the energy analysis slit 28. The quadrupole lens 26 may be formed in an electrostatic or a magnetic field type. Accordingly, since the energy dispersion is suppressed after the ion beam is deflected in a U-shape and the beam size decreases, the beam may be transported with high efficiency. Further, since the conductance decreases at the magnetic pole portion of the deflection electromagnet, it is effective to dispose an outgas discharging vacuum pump exhausts outgas in the vicinity of, for example, the energy analysis slit 28. In a case where a magnetically levitated turbo molecular pump is used, the pump needs to be provided at a position where the pump is not influenced by the leakage magnetic field of the electromagnet of the energy analysis electromagnet 24 or the deflection electromagnet 30. By the vacuum pump, the beam current degradation due to the diffusing of the remaining gas at the deflection unit is prevented.

When there is a large installation error in the quadrupole lens in the high-energy multi-stage linear acceleration unit 14, the dispersion adjusting quadrupole lens 26, or the beam focusing/defocusing unit 32, the center orbit of the beam illustrated in FIG. 5B is distorted, and the beam may easily disappear while contacting the slit. As a result, the final implantation angle and the final implantation position are also wrong. Here, the center orbit of the beam essentially passes through the center of the beam scanner 34 on the horizontal plane due to the magnetic field correction value of the deflection electromagnet 30 having an implantation angle correction function. Accordingly, the deviation of the implantation angle is corrected. Further, when an appropriate offset voltage is applied to the beam scanner, the distortion of the center orbit from the scanner to the wafer disappears, and hence the horizontal deviation of the implantation position is solved.

The ions that pass through the deflection electromagnets of the beam deflection unit 16 are subjected to a centrifugal force and a Lorentz force, and hence draws a circular-arc orbit by balance of these forces. When this balance is represented by a relation, a relation of mv=qBr is established. Here, m indicates the mass of the ion, v indicates the velocity of the ion, q indicates the charge state of the ion, B indicates the magnetic flux density of the deflection electromagnet, and r indicates the curvature radius of the orbit. Only the ions in which the curvature radius r of the orbit matches the curvature radius of the magnetic center of the deflection electromagnet may pass through the deflection electromagnet. In other words, in a case where the ions have the same charge state, the ions that may pass through the deflection electromagnet applied with the uniform magnetic field B are only the ions having the specific momentum mv. The EFM is called the energy analysis electromagnet, but is actually a device that is used to analyze the momentum of the ion. The BM or the mass analysis electromagnet of the ion generation unit is the momentum filter.

Further, the beam deflection unit 16 may deflect the ion beam by 180° just by using a plurality of magnets. Accordingly, the high-energy ion implanter 100 in which the beamline has a U-shape may be realized by a simple configuration.

As illustrated in FIG. 5A, the beam deflection unit 16 deflects the ion beam emitted from the high-energy multi-stage linear acceleration unit 14 by 90° using the energy analysis electromagnet 24. Then, the beam path is further deflected by 90° using the deflection electromagnet 30 that is also used to correct the orbit, and is incident to the beam focusing/defocusing unit 32 of the beam transportation unit 18 to be described later. The beam focusing/defocusing unit 32 shapes the incident beam and supplies the beam to the beam scanner 34. Further, the divergence of the beam due to the energy dispersion is prevented by the lens effect of the quadrupole lens 26 illustrated in FIG. 5B or an extreme decrease in the size of the beam is prevented by using the beam expansion effect based on the energy dispersion.

Figure 11A:
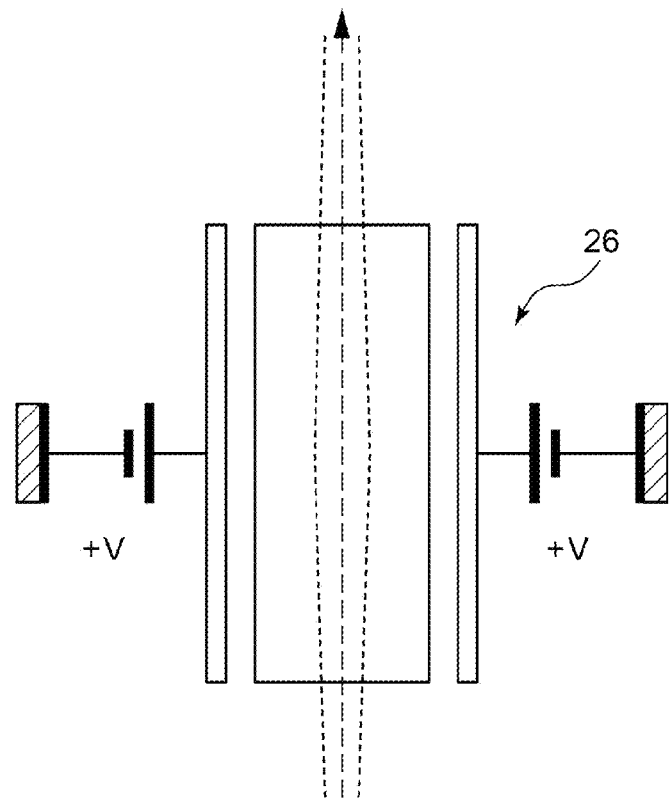
FIG. 11A is a schematic top view illustrating a quadrupole lens as a horizontal focusing lens.
Figure 11B:
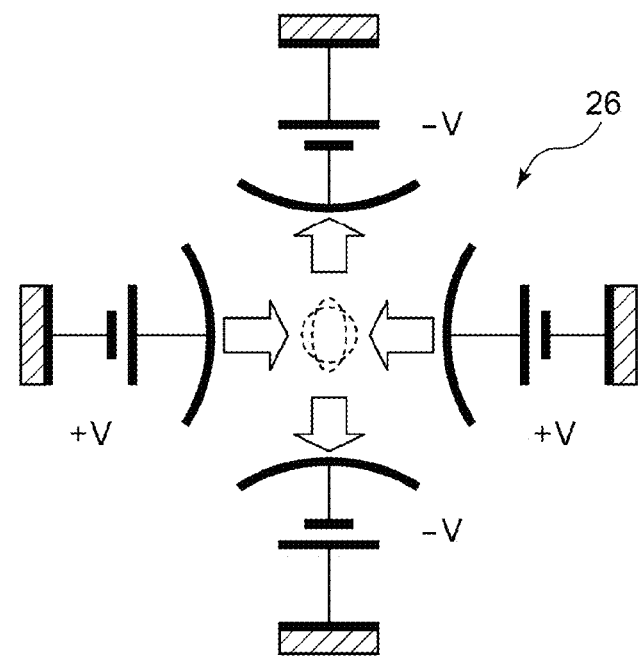
FIG. 11B is a schematic front view illustrating the quadrupole lens.

FIG. 11A is a schematic top view illustrating a quadrupole lens as a horizontal focusing lens, and FIG. 11B is a schematic front view illustrating the quadrupole lens. The top view of FIG. 11A illustrates the electrode length in the beamline traveling direction of the quadrupole lens 26 and the effect in which the beam that diverges laterally with respect to the beam of the energy selected by the energy analysis electromagnet (the EFM deflection magnet) 24 converges laterally by the quadrupole lens 26. The front view of FIG. 11B illustrates the horizontal focusing effect of the beam based on the convergence and divergence action of the electrode of the quadrupole lens 26.

As described above, the beam deflection unit 16 performs the deflection of the ion beam by 180° by a plurality of electromagnets between the high-energy multi-stage linear acceleration unit 14 and the beam transportation unit 18 in the ion implanter that accelerates the ions generated from the ion source and transports the ions to the wafer so as to implant the ions thereto. That is, the energy analysis electromagnet 24 and the orbit correction deflection electromagnet 30 are respectively formed so as to have deflection angles of 90°. As a result, the total deflection angle becomes 180°. Furthermore, the amount of the deflection performed by one magnet is not limited to 90°, and may be the following combination.

(1) One magnet having deflection amount of 90°+two magnets having deflection amounts of 45°
(2) Three magnets having deflection amounts of 60°
(3) Four magnets having deflection amounts of 45°
(4) Six magnets having deflection amounts of 30°
(5) One magnet having deflection amount of 60°+one magnet having deflection amount of 120°
(6) One magnet having deflection amount of 30°+one magnet having deflection amount of 150°

The beam deflection unit 16 as the energy analysis unit is a folding path in the U-shaped beamline, and the curvature radius r of the deflection electromagnet forming the unit is an important parameter that limits the maximum energy of the beam to be transported and determines the entire width of the apparatus or the width of the center maintenance area (see FIGS. 5A and 5B). When the value is optimized, an increase in the entire width of the apparatus is suppressed without decreasing the maximum energy. Then, the gap between the high-energy multi-stage linear acceleration unit 14 and the beam transportation unit 18 is widened, so that a sufficient work space R1 is ensured (see FIG. 1).

Figure 13:
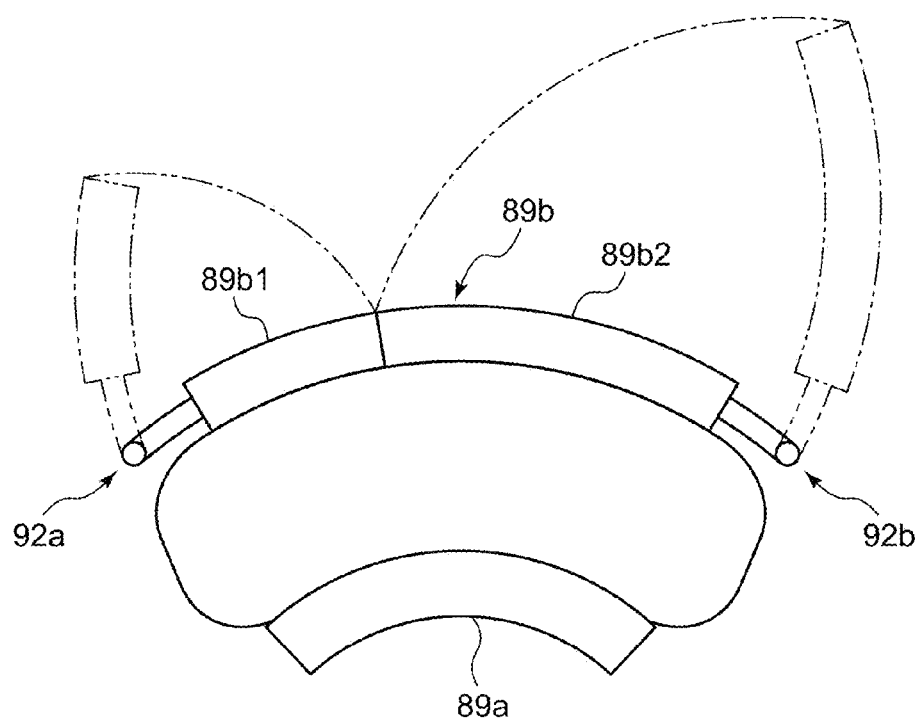
FIG. 13 is a schematic view illustrating an opening and closing portion included in the electromagnet.

FIGS. 12A and 12B are perspective views illustrating an example of a configuration of the electromagnet. FIG. 13 is a schematic view illustrating an opening and closing portion provided in the electromagnet. For example, as illustrated in FIGS. 12A and 12B, the electromagnet forming the energy analysis electromagnet 24 or the deflection electromagnet 30 includes an upper yoke 87, a lower yoke 88, inner and outer yokes 89a and 89b, an upper pole (not illustrated), a lower pole 93, an upper coil 91a, and a lower coil 91b. Further, as illustrated in FIG. 13, the outer yoke 89b is divided into two members 89b1 and 89b2, and the two members may be opened outward as folding double doors by opening and closing portions 92a and 92b. Then, a beam guide container (not illustrated) forming the beamline may be removably attached thereto.

Further, the vacuum chamber of the center portion of the beam deflection unit 16, for example, the container accommodating the energy spread confining slit 27, the quadrupole lens 26, the energy analysis slit 28, and the like may be easily attached to and detached from the beamline. Accordingly, it is possible to simply enter and exit the work area of the center of the U-shaped beamline during the maintenance work.

The high-energy multi-stage linear acceleration unit 14 includes a plurality of linear accelerators that accelerate the ions. Each of the plurality of linear accelerators includes a common connection portion, and the connection portion may be removably attached to the energy analysis electromagnet 24 located at the upstream side in relation to the energy analysis slit 28 in the plurality of electromagnets. Similarly, the beam transportation unit 18 may be removably attached to the deflection electromagnet 30.

Further, the energy analysis electromagnet 24 that is installed at the upstream side of the energy analysis slit 28 and includes the electromagnet may be formed so as to attached and detached or connected to the upstream high-energy multi-stage linear acceleration unit 14. Further, in a case where the beam transportation unit 18 to be described later is configured as a module type beamline unit, the deflection electromagnet 30 that is installed at the downstream side of the energy analysis slit 28 may be attached and detached or connected to the downstream beam transportation unit 18.

The linac and the beam deflection unit are respectively disposed on plane trestles, and are formed so that the ion beam orbit passing through the units are substantially included in one horizontal plane (the orbit after the deflection of the final energy filter is excluded).

(Beam Transportation Unit)

FIG. 6A is a top view illustrating a schematic configuration from the beam scanner to the substrate processing/supplying unit along the beamline after the beam collimator, and FIG. 6B is a side view illustrating a schematic configuration from the beam scanner to the substrate processing/supplying unit along the beamline after the beam collimator.

Only the necessary ion species are separated by the beam deflection unit 16, and the beam that is formed only by the ions having a necessary energy value is shaped in a desired cross-sectional shape by the beam focusing/defocusing unit 32. As illustrated in FIGS. 5A to 6B, the beam focusing/defocusing unit 32 is configured as (an electrostatic or a magnetic field type) convergence/divergence lens group such as a Q (quadrupole) lens. The beam having a shaped cross-sectional shape is scanned in a direction parallel to the surface of FIG. 1A by the beam scanner 34. For example, the beam focusing/defocusing unit is configured as a triplet Q lens group including a horizontal focusing (longitudinal divergence) lens QF/a lateral divergence (a vertical focusing) lens QD/a horizontal focusing (a longitudinal divergence) lens QF. If necessary, the beam focusing/defocusing unit 32 may be configured by each of the horizontal focusing lens QF and the lateral divergence lens QD or the combination thereof.

As illustrated in FIGS. 5A and 5B, the faraday cup 80b (called a resolver-faraday cup) for measuring the total beam current of the ion beam is disposed at a position directly before the beam focusing/defocusing unit 32 of the foremost portion inside the scanner housing.

FIG. 14A is a schematic front view illustrating the resolver-faraday cup 80b, and FIG. 14B is a schematic view illustrating an operation of the resolver-faraday cup 80b.

The resolver-faraday cup 80b is formed so as to be extracted in the vertical direction on the beamline by a driving mechanism, and is formed so that the opening faces the upstream side of the beamline while having a rectangular square shape in the horizontal direction. The resolver-faraday cup is used to completely interrupt the ion beam that reaches the downstream side of the beamline if necessary other than the purpose of measuring the total beam current of the ion beam during the adjustment of the linac and the beam deflection portion. Further, the resolver-faraday cup 80b, the beam scanner 34, a suppression electrode 74, and ground electrodes 76a, 78a, and 78b are accommodated in a scanner housing 82.

The beam scanner 34 is a deflection scan device (called a beam scanner) that causes the ion beam to periodically scan the horizontal direction perpendicular to the ion beam traveling direction in a reciprocating manner by the periodically changing electric field.

The beam scanner 34 includes a pair of (two) counter scan electrodes (bipolar deflection scan electrodes) that are disposed so as to face each other with the ion beam passage region interposed therebetween in the beam traveling direction. Then, a scan voltage that changes to positive and negative values at a predetermined frequency in the range of 0.5 Hz to 4000 Hz and is approximated to the triangular wave is applied to two counter electrodes in the form of positive and negative inversely. The scan voltage generates a changing electric field that deflects the beam passing through the gap between two counter electrodes. Then, the beam that passes through the gap is scanned in the horizontal direction by the periodic change of the scan voltage.

The amount of the crystal damage generated inside the silicon wafer during the high-energy ion implantation is inverse proportional to the scan frequency. Then, there is a case in which the amount of the crystal damage influences the quality of the produced semiconductor device. In such a case, the quality of the produced semiconductor device may be improved by freely setting the scan frequency.

Further, an offset voltage (a fixed voltage) is superimposed on the scan voltage in order to correct the amount of the beam positional deviation measured directly near the wafer in a state where the scan voltage is not applied thereto. Accordingly, the scan range is not deviated in the horizontal direction due to the offset voltage, and hence the bilaterally symmetrical ion implantation may be performed.

The suppression electrode 74 that includes an opening in the ion beam passage region is disposed between two ground electrodes 78a and 78b at the downstream side of the beam scanner 34. The ground electrode 76a is disposed before the scan electrode at the upstream side thereof, but if necessary, the suppression electrode having the same configuration as that of the downstream side may be disposed. The suppression electrode suppresses the intrusion of electrons to the positive electrode.

Further, a ground shielding plate 89 is disposed at each of the upper and lower sides of deflection electrodes 87a and 87b. The ground shielding plate prevents the secondary electrons accompanied by the beam from flowing to the positive electrode of the beam scanner 34 from the outside. The power supply of the scanner is protected by the suppression electrode and the ground shielding plate, and hence the orbit of the ion beam is stabilized.

A beam parking function is provided at the rear side of the beam scanner 34. The beam parking function is formed so that the ion beam passing through the beam scanner is largely deflected in the horizontal direction if necessary so as to be led to the beam dump.

The beam parking function is a system that instantly stops the transportation of the beam within 10 μs in a case where an implantation error such as a dose uniformity error occurs when an unexpected problem such as a discharge of an electrode occurs during the ion implantation and an implantation operation is continued. In fact, at the moment in which the noticeable degradation in the beam current is detected, the output voltage of the beam scanner power supply is increased to 1.5 times the voltage corresponding to the maximum scan width, and the beam is led to the beam dup near the parallelizing lens. The beam irradiation position on the wafer at the moment in which the problem occurs is stored, and the beam is returned to the original orbit at the moment in which the wafer moves for the scanning operation in the vertical direction moves to the position after the problem is solved, thereby continuing the ion implantation as if no problem occurs.

In this way, the voltage of the power source that responds at a high speed cannot be set to be very high because of a cost problem. Meanwhile, in order to acquire a high degree of uniformity of an implantation dose, the scan range needs to be wider than the wafer. Accordingly, it is necessary that the beam scanner has a capability of sufficiently deflecting a high-energy beam. This can be realized by arranging restrictions on the gap and the length of the deflection electrodes of the beam scanner. In the energy area according to this embodiment, the electrode length may be set to be five times or more the gap.

A beam scan space portion is provided in a long section at the downstream side of the beam scanner 34 inside the scan housing, and hence a sufficient scan width may be obtained even when the beam scan angle is narrow. At the rear side of the scan housing located at the downstream side of the beam scan space portion, the deflected ion beam is adjusted to be directed to the direction of the ion beam before the beam is deflected. That is, the beam collimator 36 is installed which curves the beam so as to be parallel to the beamline.

Since the aberration (a difference in focal distance between the center portion of the beam collimator and left and right ends) generated in the beam collimator 36 is proportional to the square of the deflection angle of the beam scanner 34, the aberration of the beam collimator may be largely suppressed when the beam scan space portion is increased in length and the deflection angle is decreased. If the aberration is large, the center portion and the left and right ends have different beam sizes and beam divergence angles when the ion beam is implanted into the semiconductor wafer, and hence the quality of the product becomes non-uniform.

Further, when the length of the beam scan space portion is adjusted, the length of the beam transportation unit may match the length of the high-energy multi-stage linear acceleration unit 14.

Figure 7:
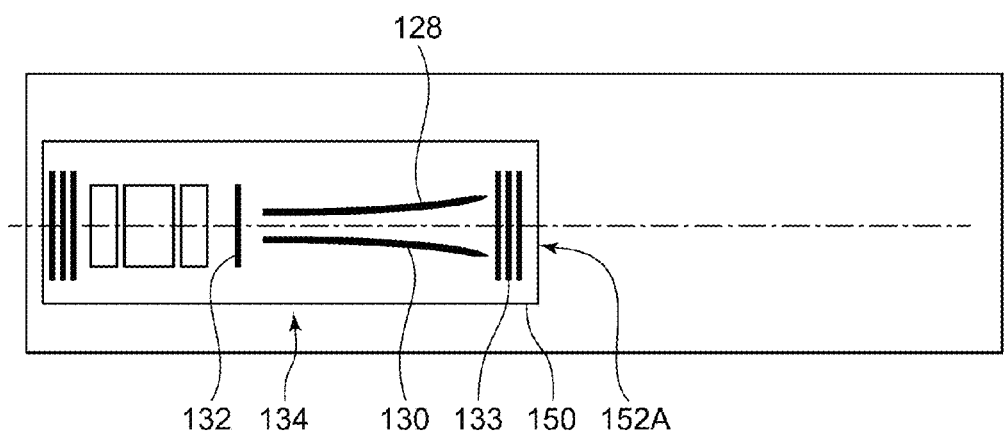
FIG. 7 is a schematic top view illustrating a main part of an example of the beam scanner.
Figure 8:
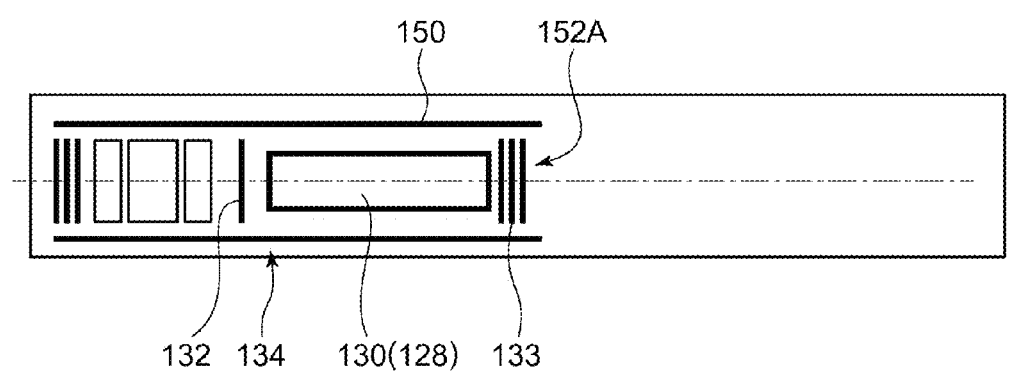
FIG. 8 is a schematic side view illustrating a main part of an example of the beam scanner.
Figure 9:
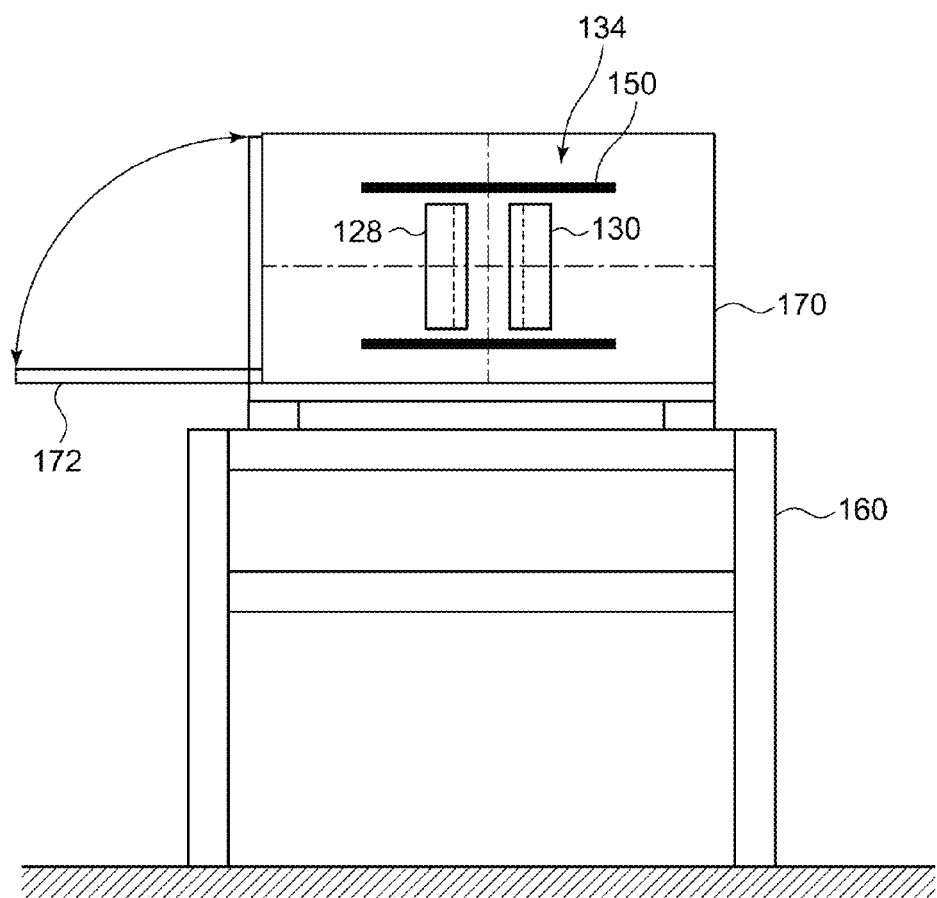
FIG. 9 is a schematic front view illustrating a structure in which an example of the beam scanner is removably attached to a halfway position of an ion beamline path when viewed from the downstream side.

FIG. 7 is a schematic top view illustrating a main part of an example of the beam scanner. FIG. 8 is a schematic side view illustrating a main part of an example of the beam scanner. FIG. 9 is a schematic front view illustrating a structure in which an example of the beam scanner is removably attached to the halfway position of the ion beamline when viewed from the downstream side.

As illustrated in FIGS. 7 and 8, in a beam scanner 134, a pair of deflection electrodes 128 and 130 and ground electrodes 132 and 133 assembled near the upstream and downstream sides thereof are accommodated and installed inside a box 150. An upstream opening (not illustrated) and an opening 152A (see FIG. 8) larger than the opening of the ground electrode 133 are respectively provided at the positions corresponding to the openings of the ground electrodes 132 and 133 at the upstream side surface and the downstream side surface of the box 150.

The connection between the deflection electrode and the power supply is realized in the feed through structure. Meanwhile, the upper surface of the box 150 is provided with a terminal and a ground terminal used to connect the deflection electrodes 128 and 130 to the power supply. Further, a handle which is suitable for the attachment or the transportation is provided at each of side surfaces of the box 150 parallel to the beam axis. Furthermore, the box 150 is provided with a vacuum evacuation opening that decreases the pressure inside the beam scanner 134, and the vacuum evacuation opening is connected to a vacuum evacuation pump (not illustrated).

As illustrated in FIG. 9, the box 150 is slidably provided in a beam guide box 170 fixed onto a trestle 160. The beam guide box 170 is sufficiently larger than the box 150, and the bottom portion thereof is provided with two guide rails for sliding the box 150. The guide rail extends in a direction perpendicular to the beam axis, and the side surface of the beam guide box 170 of one end side thereof may be opened and closed by a door 172. Accordingly, the box 150 may be simply extracted from the beam guide box 170 during the repair and the check of the beam scanner 134. Furthermore, in order to lock the box 150 press-inserted into the beam guide box 170, the other end of the guide rail is provided with a locking mechanism (not illustrated).

The scanner peripheral unit members are work targets during the maintenance of the beamline, and the maintenance work may be easily performed from the work space R1. Similarly, the maintenance work of the high-energy multi-stage linear acceleration unit 14 may be easily performed from the work space R1.

The beam collimator 36 is provided with an electrostatic parallelizing lens 84. As illustrated in FIGS. 6A and 6B, the electrostatic parallelizing lens 84 includes a plurality of acceleration electrode sets and a plurality of deceleration electrode sets substantially having a hyperbolic shape. Each of the pair of electrodes faces each other with an acceleration-deceleration gap interposed therebetween and having a width not causing a discharge, and the acceleration-deceleration gap forms an electric field that is strengthened in proportional to a distance between the reference axis and the axial element causing the acceleration-deceleration velocity of the ion beam and having an element of influencing the horizontal focus of the ion beam.

The downstream electrode in the pair of electrodes with the acceleration gap interposed therebetween and the upstream electrode of the deceleration gap are formed as an integrated structure and the downstream electrode of the deceleration gap and the upstream electrode of the next acceleration gap are formed as an integrated structure so as to have the same potential. As illustrated in FIG. 6B, each of the structures includes an upper unit and a lower unit, and a space portion through which the ion beam passes is formed between the upper unit and the lower unit.

From the upstream side of the electrostatic parallelizing lens 84, the first electrode (the incident electrode) and the final electrode (the emission electrode) are maintained at the ground potential. Accordingly, the energy of the beam at the positions before and behind the parallelizing lens 84 does not change.

In the intermediate electrode structure, the exit electrode of the acceleration gap and the entrance electrode of the deceleration gap are connected with a negative power supply 90 having a variable constant voltage, and the exit electrode of the deceleration gap and the entrance electrode of the acceleration gap are connected with a plus power supply having a variable constant voltage (at the n-stage, negative, positive, negative, positive, negative, and the like). Accordingly, the ion beam is gradually directed toward the direction parallel to the center orbit of the beamline while being accelerated and decelerated repeatedly. Finally, the ion beam reaches the orbit parallel to the ion beam traveling direction (the beamline orbit direction) before the deflection scanning operation.

In this way, the beam that is scanned by the beam scanner 34 becomes parallel to the axis (the reference axis) of the deflection angle 0° parallel to the ion beam traveling direction (the beamline orbit direction) before the scan operation by the beam collimator 36 including the electrostatic parallelizing lens and the like. At this time, the scan region is formed so as to be bilaterally symmetrical to each other with respect to the reference axis.

The ion beam that is emitted from the electrostatic parallelizing lens 84 is sent to the electrostatic final energy filter 38 (AEF (94): Angular Energy Filter). In the final energy filter 94, a final analysis is performed on the energy of the ion beam to be directly implanted into the wafer, only the ion species having a necessary energy value are selected, and the neutralized particles or the ions having a different ion charge state are removed. The final energy filter 94 of the electric field deflection is configured as a plate-shaped deflection electrode including a pair of plane or curved surfaces facing each other in the vertical direction of the beamline orbit direction, is curved downward by the deflection action of the final energy filter 94 in the vertical direction of the beamline orbit direction, and is curved so as to match the ion beam orbit.

As illustrated in FIGS. 6A and 6B, the electric field deflection electrode is configured as a pair of AEF electrodes 104, and is disposed so that the ion beam is interposed from the vertical direction. In the pair of AEF electrodes 104, a positive voltage is applied to the upper AEF electrode 104, and a negative voltage is applied to the lower AEF electrode 104. During the deflection by the electric field, the ion beam is deflected downward by about 10 to 20° by the action of the electric field generated between the pair of AEF electrodes 104, and hence only the ion beam having target energy is selected. As illustrated in FIG. 6B, only the ion beam having a charge state selected in the final energy filter 94 is deflected downward at the set orbit angle. The beam that is formed by only the ions selected in this way is uniformly irradiated to the wafer 200 as the irradiation target at an accurate angle.

Figure 10:
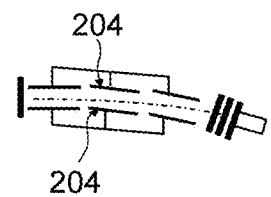
FIG. 10 is a schematic view illustrating another aspect of a deflection electrode of an angle energy filter.

In a case where the high-energy beam is actually deflected, a pair of plate-shaped deflection electrodes 204 facing each other in the vertical direction is divided into n number of segments in the longitudinal direction in accordance with the deflection angle and the curvature radius when the deflection electrodes are curved so as to match the ion beam orbit as illustrated in FIG. 10. Thus, the production precision or the economic efficiency is excellent in the plate-shaped electrode of which the upper electrode and the lower electrode are maintained at the same potential. Further, the plate-shaped deflection electrode that is divided into n number of segments in the longitudinal direction may be formed as n number of upper and lower plate-shaped electrodes set to different potentials other than the configuration in which the upper electrode and the lower electrode are maintained at the same potential.

With such a structure, the electrostatic energy filter may be mounted on the high-energy scanned beam transportation line. Since the beam is deflected in a direction perpendicular to the beam scan surface by the electric field, the energy analysis may be performed without influencing the implantation ion density distribution (the uniformity) in the beam scan direction.

Further, in addition to the mounted final energy filter, the beamline is equipped with three kinds of beam filters, that is, the radio frequency linear accelerator of the high-energy multi-stage linear acceleration unit 14, the magnetic field type EFM (the energy analysis electromagnet 24) and the BM (the deflection electromagnet 30) of the U-shaped deflection portion, and the final energy filter. As described above, the radio frequency linear accelerator is the velocity (v) filter, the EFM and the BM are the momentum (mv) filters, and the final energy filter is the energy ($mv^2/2$) filter as its name. In this way, when the different triple filters are used, a very pure ion beam that has high energy purity compared to the related art and has a small amount of particles or metal contamination may be supplied to the wafer.

Furthermore, in function, the EFM removes the energy contamination sneaking through the radio frequency linear accelerator or limits the energy spread with high resolution, and the AEF mainly removes the ions subjected to a change in charge state by the resist outgas by the beam transportation unit after the energy analysis using the EFM with comparatively low resolution.

The final energy filter 94 includes a ground electrode 108 that is provided at the upstream side of the final energy filter 94 and an electrode set provided with an AEF suppression electrode 110 provided between two ground electrodes at the downstream side. The AEF suppression electrode 110 suppresses the intrusion of the electrons to the positive electrode.

Dose cups 122 that are disposed at the left and right ends of the most downstream ground electrode of the final energy filter 94 measure the amount of the beam current to be implanted based on the dose amount.

(Substrate Processing/Supplying Unit)

In FIG. 6A, the arrow near the wafer 200 indicates the beam scanned in the arrow direction. Then, in FIG. 6B, the arrow near the wafer 200 indicates the reciprocation movement, that is, the mechanical scanning operation of the wafer 200 in the arrow direction. That is, when the beam is scanned in a reciprocating manner in, for example, one axial direction, the wafer 200 is driven by a driving mechanism (not illustrated) so that the wafer moves in a reciprocating manner in a direction perpendicular to the one axial direction.

The substrate processing/supplying unit 20 that supplies the wafer 200 to a predetermined position and performs an ion implantation thereon is accommodated in a process chamber (an implantation process chamber) 116. The process chamber 116 communicates with an AEF chamber 102. An energy defining slit (EDS) 118 is disposed inside the process chamber 116. The energy defining slit 118 is formed as a slit that is laterally long in the scan direction in order to separate only the ion beam having a meaningful energy value and a meaningful charge state and passing through the AEF by limiting the passage of the ion beam having a non-meaningful energy value and a non-meaningful charge state. Further, the energy defining slit 118 forms a slit body by a movable member in the vertical direction so as to adjust the separation gap of the slit, and may be used for various measurement purposes such as an energy analysis or an implantation angle measurement. Further, the movable upper and lower change slit members include a plurality of slit surfaces, and the slit width may be changed to a desired slit width in a manner such that the slit surfaces are changed and the axes of the upper and lower slits are adjusted or rotated in the vertical direction. A configuration may be also employed which decreases the cross contamination by sequentially changing the plurality of slit surfaces in response to the ion type.

A plasma shower 120 supplies low-energy electrons to the entire surface of the wafer 200 and the ion beam on the orbit in response to the beam current of the ion beam, and suppresses the charge-up of the positive charge generated in the ion implantation. Furthermore, a dose cup (not illustrated) that measures the dose amount may be disposed at each of left and right ends of the plasma shower 120 instead of the dose cups 122 disposed at the left and right ends of the most downstream ground electrode of the final energy filter 94.

A beam profiler 124 includes a beam profiler cup (not illustrated) that measures the beam current at the ion implantation position. The beam profiler 124 measures the ion beam density at the ion implantation position in the beam scan range while moving in the horizontal direction before the ion implantation. In a case where the predetermined non-uniformity (PNU) of the ion beam does not satisfy the request of the process as a result of the beam profile measurement, the PNU is automatically adjusted to satisfy the process condition by correcting the control function of the application voltage of the beam scanner 34. Further, a configuration may be also employed in which a vertical profile cup (not illustrated) is provided in parallel to the beam profiler 124, the beam shape and the beam X-Y position are measured, the beam shape at the implantation position is checked, and the implantation angle or the beam divergence angle is checked by the combination of the beam width, the beam center position, and the divergence mask.

Figure 15:
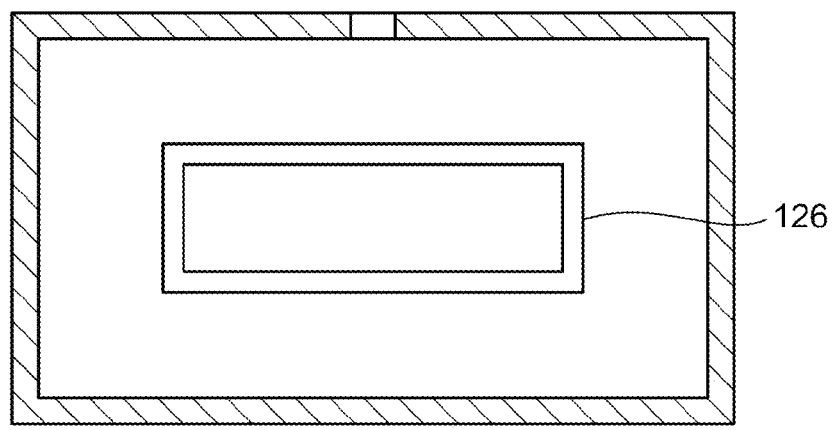
FIG. 15 is a schematic front view illustrating a lateral elongated faraday cup.

A lateral elongated faraday cup 126 with a beam current measurement function capable of measuring the ion beam in the scan range in the wafer region is disposed at the most downstream side of the beamline, and is configured to measure the final setup beam. FIG. 15 is a schematic front view illustrating the lateral elongated faraday cup. Furthermore, in order to reduce the cross contamination, the lateral elongated faraday cup 126 may include a changeable bottom surface of a faraday cup of a tripe surface structure capable of changing three surfaces of a triangular prism in response to the ion type. Further, a configuration may be also employed in which a vertical profile cup (not illustrated) is provided in parallel to the lateral elongated faraday cup 126, the beam shape or the vertical beam position is measured, and the implantation angle or the beam divergence in the vertical direction at the implantation position is monitored.

As described above, the high-energy ion implanter 100 is formed so that the units are disposed in a U-shape so as to surround the work space R1 as illustrated in FIG. 1. For this reason, a worker in the work space R1 may perform the replacement, the maintenance, and the adjustment of the parts of many units. Hereinafter, in the beam scanner as an example, an opening/closing mechanism that enables an access to the inside of the unit will be described.

(Consideration of Entire Layout, Maintenance Workability, Manufacturability, and Global Environment)

The high-energy ion implanter 100 according to the embodiment accelerates the ion beam generated in the ion beam generation unit 12 by the high-energy multi-stage linear acceleration unit 14, changes the direction of the ion beam by the beam deflection unit 16, and irradiates the ion beam to the substrate existing in the substrate processing/supplying unit 20 provided at the termination end of the beam transportation unit 18.

Further, the high-energy ion implanter 100 includes the high-energy multi-stage linear acceleration unit 14 and the beam transportation unit 18 as the plurality of units. Then, the high-energy multi-stage linear acceleration unit 14 and the beam transportation unit 18 are disposed so as to face each other with the work space R1 illustrated in FIG. 1 interposed therebetween. Accordingly, since the high-energy multi-stage linear acceleration unit 14 and the beam transportation unit 18 disposed substantially linearly in the apparatus of the related art are disposed in a folded state, an increase in the entire length of the high-energy ion implanter 100 may be suppressed. Further, the curvature radiuses of the plurality of deflection electromagnets forming the beam deflection unit 16 are optimized so as to minimize the width of the apparatus. With such a configuration, the installation area of the apparatus is minimized, and the maintenance or the like of the high-energy multi-stage linear acceleration unit 14 or the beam transportation unit 18 may be performed in the work space R1 interposed between the high-energy multi-stage linear acceleration unit 14 and the beam transportation unit 18.

Further, the plurality of units constituting the high-energy ion implanter 100 includes the ion beam generation unit 12 that is provided at the upstream side of the beamline and generates the ion beam, the substrate processing/supplying unit 20 that is provided at the downstream side of the beamline and supplies the substrate so as to perform a process in which ions are implanted into the substrate, and the beam deflection unit 16 that is provided at the halfway position of the beamline from the ion beam generation unit 12 toward the substrate processing/supplying unit 20 and deflects the orbit of the ion beam. Then, the ion beam generation unit 12 and the substrate processing/supplying unit 20 are disposed at one side of the entire beamline, and the beam deflection unit 16 is disposed at the other side of the entire beamline. Accordingly, since the ion source 10 that needs to be subjected to the maintenance within a comparatively short time and the substrate processing/supplying unit 20 that needs to supply and acquire the substrate are disposed so as to be adjacent to each other, the movement area of the worker may be small.

Further, the high-energy multi-stage linear acceleration unit 14 includes a plurality of linear accelerators that accelerate the ions, and each of the plurality of linear accelerators may include a common connection portion. Accordingly, the number or the type of the linear accelerator may be easily changed in response to the energy necessary for the ions implanted into the substrate.

Further, the beam scanner 34 as the scanner device and the beam collimator 36 as the parallelizing lens device may include a standard-shaped connection portion with respect to the adjacent units. Accordingly, the number or the type of the linear accelerator may be easily changed. Then, the beam scanner 34 or the beam collimator 36 may be selected in response to the configuration and the number of the linear accelerator included in the high-energy multi-stage linear acceleration unit 14.

Further, in the high-energy ion implanter 100, the alignment (the positional adjustment) of the beam may be performed by integrating the vacuum chamber and the frame of each device and performing the assembly in accordance with the reference position of the vacuum chamber or the frame of the device. Accordingly, the troublesome alignment operation may be minimized, and the device set-up time may be shortened. Accordingly, the deviation of the axis caused by the mistake in work may be suppressed. Further, the alignment of the vacuum chambers may be performed by the unit of the module. Accordingly, the work load may be reduced. Further, the size of the modulated device may be decreased to be equal to or smaller than the size in which the device may easily move. Accordingly, the relocation load of the module or the high-energy ion implanter 100 may be reduced.

Further, the high-energy ion implanter 100 may be formed so that the high-energy multi-stage linear acceleration unit 14, the beam transportation unit 18, the exhaust device, and the like are assembled to a single trestle. Further, the high-energy ion implanter 100 is formed so that the high-energy multi-stage linear acceleration unit 14, the beam deflection unit 16, and the beam transportation unit 18 are included in one plane on the plane base. Accordingly, since each block of the high-energy ion implanter 100 may be directly transported while the blocks are fixed onto one plane base, a deviation in adjustment hardly occurs, and hence an effort for re-adjusting the blocks on site may be reduced. For this reason, it is possible to prevent an uneconomical problem in which many experts are sent to the installation site for a long period of time.

Further, when the plane base is formed in the middle portion of the trestle instead of the floor thereof, only the devices directly involved with the ion beam orbit may be mounted onto the plane base. Then, when a component such as a radio frequency cubic circuit as an auxiliary device may be assembled in the space formed below the plane base, the space utilization efficiency may be improved, and hence the ion implanter having a compacter size may be realized.

Thus, the high-energy ion implanter 100 may be also installed in a site where a sufficient installation place is not ensured, and may be used in a manner such that the high-energy ion implanter is transported to a demanded place in a state where the apparatus is assembled and adjusted inside a production factory, is fixed at the installation site, and is used by the final adjustment. Further, the high-energy ion implanter 100 may realize the high-energy ion implantation while satisfying the standard level of the semiconductor production line of the semiconductor production factory.

In this way, the high-energy ion implanter 100 may be decreased in size compared to the related art by examining the layout of the units or the devices, and hence may have an installation length that is about a half of the size of the related art. Further, the ion implanter according to the embodiment may be operated in a manner such that the components are assembled to the bases inside the production factory, are loaded in a transportation vehicle to be transported to the installation site while the ion beam orbit is established through the positional adjustment on the bases, are fixed to the trestles, and then the deviation in adjustment is finely adjusted to be removed. For this reason, the ion implanter may be remarkably easily and reliably adjusted on site by a person who is not an expert, and hence the set-up time may be shortened.

Further, when the layout like the elongated U-shaped folded beamline is employed, the ion implanter capable of highly precisely implanting the high-energy ions of 5 to 8 MeV in maximum may be realized. Further, the ion implanter includes a small installation area and a sufficient maintenance area by the layout having a center passage (a center region). Further, the power consumption may be decreased by the low-power consumption operation using the electrostatic parallelizing lens, the electrostatic scanner, the electrostatic AEF, and the like during the operation of the ion implanter. In other words, the ion implanter according to the embodiment may perform the low-power consumption operation by employing the scanned beam parallelization mechanism using the electrostatic deflection type parallelizing lens device.

In the high-energy ion implanter described above, at least each device included in the beam transportation unit is the electrostatic, and accordingly, the simplification of the apparatus configuration and low-output of the power source can be implemented.

Figures 16A, 16B:
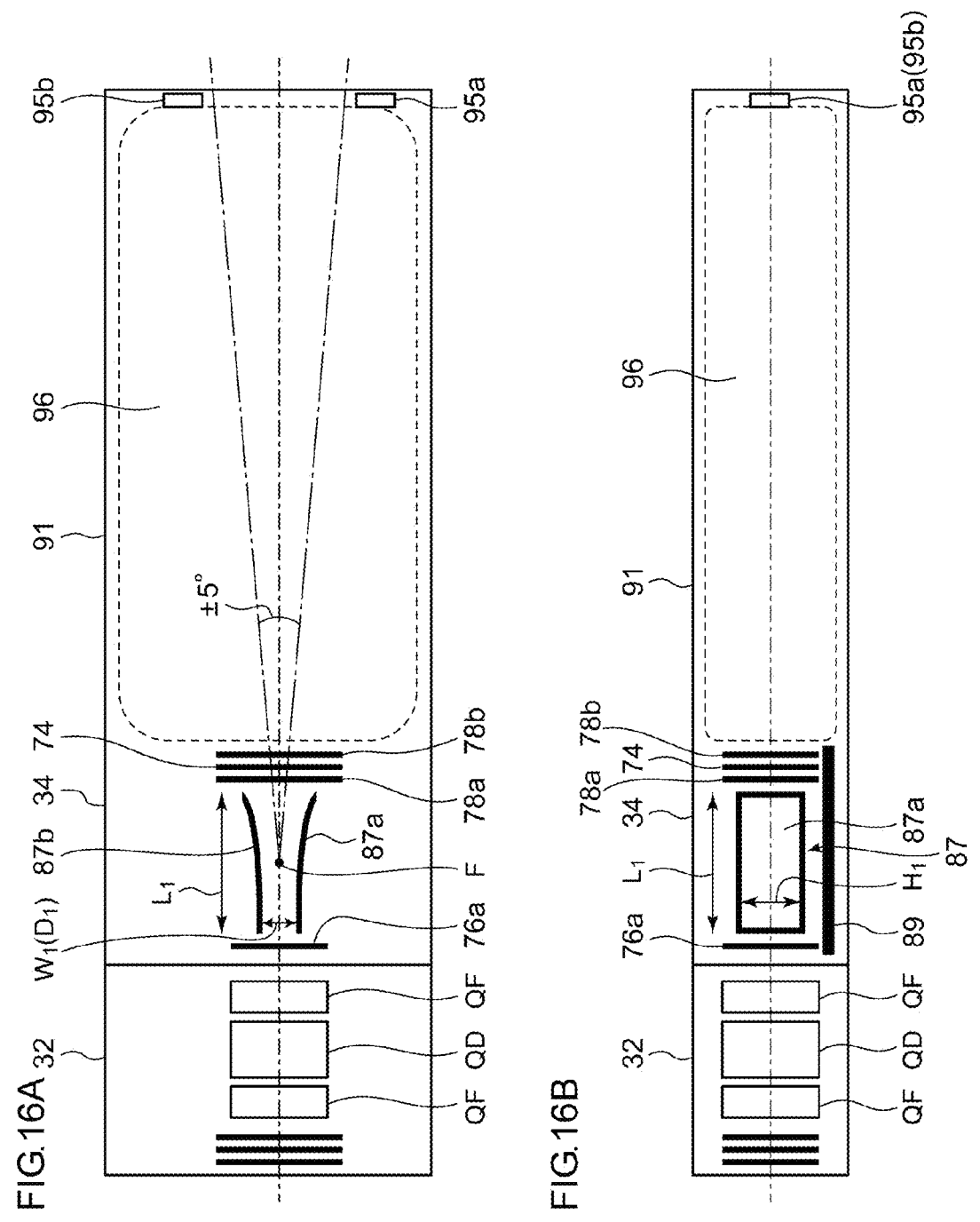

FIG. 16A is a top view illustrating a schematic configuration from the beam focusing/defocusing unit 32 to the beam scanner 34 according to this embodiment, and FIG. 16B is a side view illustrating a schematic configuration from the beam focusing/defocusing unit 32 to the beam scanner 34 according to this embodiment.

As illustrated in FIGS. 16A and 16B, the electrostatic beam scanner 34 includes one pair of deflection electrodes 87a and 87b. In addition, on the upper side and the lower side of the deflection electrodes 87a and 87b, a ground shielding plate 89 is arranged. The ground shielding plate 89 prevents secondary electrons accompanied with the beam from being wrapped around from the outer side and flowing into the electrode of the beam scanner 34. When a gap between the parallel portions of the deflection electrodes 87a and 87b forming one pair from the outer side is $W_1$, and the length of the deflection electrodes 87a and 87b in the traveling direction is $L_1$, the deflection electrodes may be configured to satisfy "$L_1 \geq 5W_1$". In addition, the power supply (amplifier) may be configured to be operable at an arbitrary scan frequency in the range of 0.5 Hz to 4 kHz. In addition, when a gap between the deflection electrodes 87a and 87b, which have no parallelizing portion, forming one pair is $D_1$, the deflection electrodes may be configured to satisfy "$L_1 \geq 5D_1$".

Generally, in order to sufficiently deflect a high-energy beam, it is necessary to allow the beam to pass inside a high-energy electric field for a long distance. In order to generate a high electric field, it is necessary to use a high voltage or narrowing the electrode gap. In addition, in the beam scanner, while it is necessary to use a high voltage power supply capable of converting a voltage into a frequency of about 1 kHz, generally, it is difficult to acquire a power supply of such a type capable of outputting a high voltage. Accordingly, it is necessary to narrow the gap between the deflection electrodes of the beam scanner.

The gap between the deflection electrodes 87a and 87b need to be larger than the width of the beam to be passed through it. Accordingly, the minimum gap between the electrodes is determined. In addition, the length of the electrodes is determined based on the beam energy, the electric field, and the deflection angle. In addition, the beam energy is determined based on the apparatus specification. The electric field is determined based on the condition represented above. Accordingly, by determining the deflection angle, the length of the electrodes is determined.

For example, in the beam scanner according to this embodiment, the gap between left and right scanner electrodes is about 60 mm (a level for which there is no problem in the withstand voltage between the electrodes in consideration of a maximum beam size of 40 mm), and the width of the scanner electrode in the beam traveling direction is set to be long so as to be about 460 mm. In addition, the scan voltage is ±30 kV, and the scan frequency is about 0.5 Hz to 4 kHz.

When the gap of the parallel portions of the deflection electrodes 87a and 87b, which form one pair, including the electrostatic beam scanner 34 is $W_1$, and the height of the deflection electrodes is $H_1$, the deflection electrodes may be configured to satisfy "$H_1 \geq 1.5W_1$". In order to perform uniform scanning over the entire beam, the electric field during scanning needs to be uniform in the vertical direction. Thus, by using the deflection electrodes having a sufficient electrode height, the electric field can be configured to be uniform.

The deflection electrode 87a (87b) has a rectangular long plate shape, and a surface thereof facing the other deflection electrode 87b (87a) is formed as a plane or a curved surface. Then, the outer surface opposite to the facing surface may have a step shape.

Further, the facing surface of the deflection electrode 87a (87b) with respect to the other deflection electrode 87b (87a) is formed as a double-stage plane, and the outer surface opposite to the facing surface may have a step shape. Accordingly, the processability (the manufacturability) is improved. In this way, since the outer surface has a simple plane structure, the processing cost may be reduced. Further, when the outer surface has a step shape and is further subjected to the grinding, the weight of the component decreases, and hence the burden of the worker during the attachment work may be reduced.

Further, the surface of the deflection electrode 87b (87a) facing the other deflection electrode 87b (87a) may be formed as a step processed in a saw edge shape. Accordingly, the metal contamination may be suppressed.

Furthermore, as described above, it is desirable that the gap between the deflection electrodes of the beam scanner be narrow. However, since the scanned beam has a width, the beam collides with the electrode when the electrode gap is too narrow. Therefore, the upstream shape of the pair of deflection electrodes is formed in a straight structure in which the deflection electrodes are parallel to each other so that the upstream gap having a non-widened scan width is narrowed, and the pair of deflection electrodes is formed in a shape which is widened by about ±5 degrees toward the downstream side in which the scan width is widened. The widened portion may have a curved shape or a step shape, but the straight structure may be more simply made at low cost.

The high-energy ion implanter 100 further includes an upstream ground electrode 78a and a downstream ground electrode 78b which are disposed at the downstream side of the beamline of the electrostatic beam scanner 34 and each of which has an opening in the ion beam passage region and a suppression electrode 74 which is disposed between the upstream ground electrode 78a and the downstream ground electrode 78b.

Figure 17:
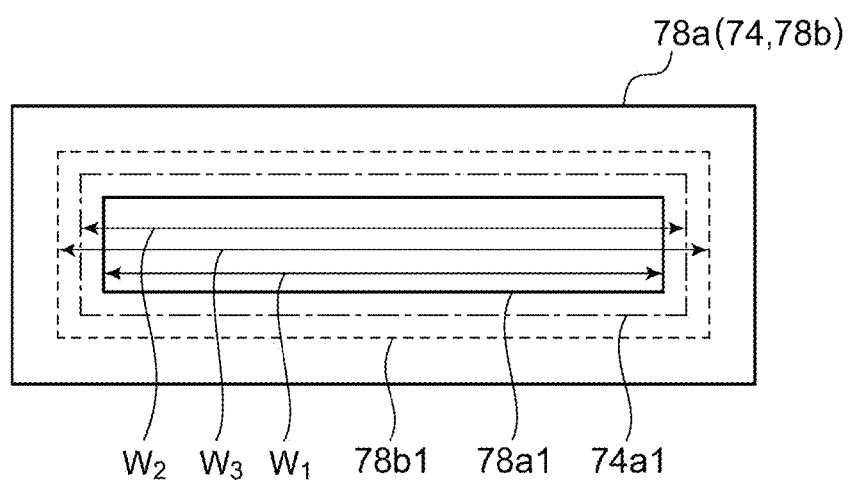
FIG. 17 is a schematic view illustrating a relation in size among an opening width of a downstream ground electrode, an opening width of a suppression electrode, and an opening width of an upstream ground electrode.

FIG. 17 is a schematic view illustrating a relation in size among the opening width of the downstream ground electrode, the opening width of the suppression electrode, and the opening width of the upstream ground electrode. When the width of an opening 78a1 of the upstream ground electrode 78a is indicated by $W_1$, the width of an opening 74a1 of the suppression electrode 74 is indicated by $W_2$, and the width of an opening 78b1 of the downstream ground electrode 78b is indicated by $W_3$, the electrodes may be formed so as to satisfy a relation of $W_1 \leq W_2 \leq W_3$. Since the scanned beam is widened in the lateral direction as it goes toward the downstream side, the scanned beam may not collide with the members when the opening widths of the suppression electrode 74 and the ground electrodes 78a and 78b are formed so as to satisfy the above-described relation.

As illustrated in FIG. 16A, the electrostatic beam scanner 34 may have a deflection angle of ±5° or less. Accordingly, the incident angle with respect to the downstream electrostatic beam collimator 36 (see FIGS. 6A and 6B) decreases, and hence the occurrence of the aberration is suppressed. The aberration (the focal distance difference between the center and the end of the beam collimator) increases in proportional to the square root of the incident angle.

A beam scan space 96 that decreases the deflection angle of the electrostatic beam scanner 34 is provided between the electrostatic beam scanner 34 and the electrostatic beam collimator 36. Accordingly, the gap between the electrostatic beam scanner 34 and the electrostatic beam collimator 36 may be widened. For this reason, even when the deflection angle of the electrostatic beam scanner 34 is small, the scanned beam is sufficiently widened until the beam reaches the electrostatic beam collimator 36. For this reason, it is possible to ensure a scan range having a sufficient width while suppressing the aberration of the beam in the electrostatic beam collimator 36.

A vacuum chamber 91 that accommodates the electrostatic beam scanner 34 and is provided with the beam scan space 96 and a vacuum pump (not illustrated) that is connected to the vacuum chamber 91 and evacuates a gas inside the vacuum chamber may be provided. For example, a turbo molecular pump for ensuring the vacuum degree may be provided at the position of the electrostatic beam scanner, and a turbo pump may be disposed directly below the electrostatic beam scanner. Accordingly, the beamline vacuum degree of the electrostatic beam scanner 34 may be ensured. Further, the outgas that is generated by the collision of the ions with respect to the electrode or the aperture near the electrostatic beam scanner 34 may be efficiently evacuated. In this way, when the generated gas may be removed as much as possible in the vicinity of the gas generation source, the amount of the gas that is dispersed in the vicinity thereof may be decreased. Further, if there is no unnecessary gas, the beam may pass without the interference of the gas, and hence the beam transportation efficiency is improved.

The electrostatic beam collimator 36 (see FIGS. 6A and 6B) is formed so that a focal point F is located in an area between the pair of deflection electrodes 87a and 87b included in the electrostatic beam scanner 34 disposed at the upstream side by interposing the beam scan space 96. When the scan range is uniform, the aberration of the beam collimator is inverse proportional to the square root of the focal distance. For this reason, the aberration may be suppressed by the installation of the beam collimator 36 having a long focal distance.

Figure 18:
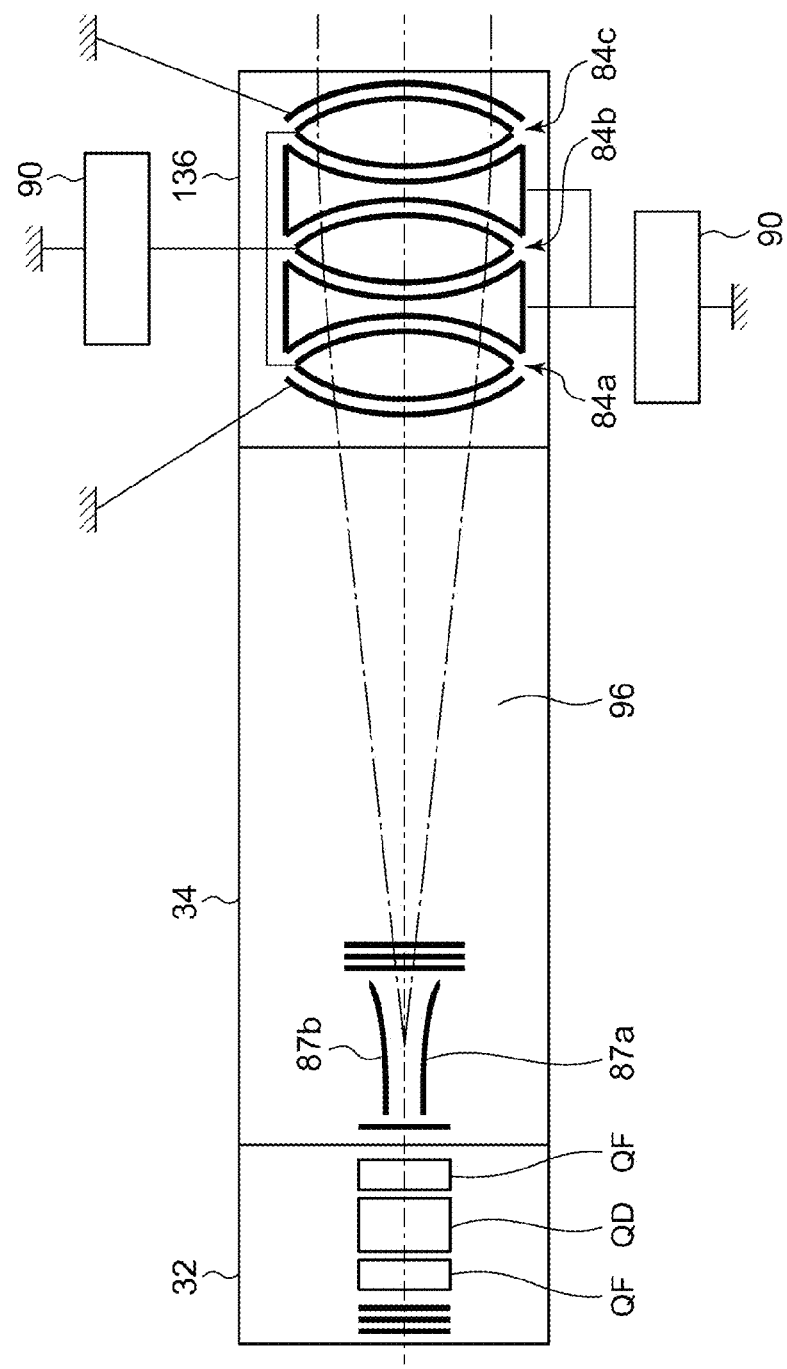
FIG. 18 is a schematic view illustrating another example of a beam collimator.

FIG. 18 is a schematic view illustrating another example of the beam collimator. An electrostatic beam collimator 136 illustrated in FIG. 18 includes multi-stage parallelizing lenses 84a, 84b, and 84c. Accordingly, since the scanned beam may be gradually collimated, the gap between the electrostatic beam scanner 34 and the electrostatic beam collimator 136, for example, the length of the beam scan space 96 may be shortened. For this reason, the entire length of the beamline may be shortened.

As illustrated in FIG. 1, the high-energy ion implanter 100 according to the embodiment forms a high-energy ion implantation beamline by a first section that includes the high-energy multi-stage linear acceleration unit 14 and the ion beam generation unit 12 with the ion source 10 and includes the elongated orbit, a second section that changes the direction of the beam by the deflection unit including the beam deflection unit 16, and a third section that includes the beam transportation unit 18 and the elongated orbit, and the first section and the third section are disposed so as to face each other, thereby forming the layout of the "U"-shaped apparatus having a facing long line portion.

Further, as illustrated in FIGS. 5A and 5B, the high-energy ion implanter 100 has a configuration in which an injector faraday cup 80a that measures the total beam current of the ion beam is provided between the ion beam generation unit 12 and the high-energy multi-stage linear acceleration unit 14 so as to be inserted into and extracted from the beamline.

Similarly, a resolver-faraday cup 80b that measures the total beam current of the ion beam is provided between the beam deflection unit 16 and the beam transportation unit 18 so as to be inserted into and extracted from the beamline.

Further, as illustrated in FIG. 1, the high-energy ion implanter 100 further includes a substrate processing/supplying unit 20 that is disposed at the downstream side of the beam transportation unit 18 and performs the ion implantation process. As illustrated in FIGS. 6A and 6B, a fixed lateral elongated faraday cup 126 that measures the total beam current of the ion beam is provided behind the ion implantation position of the substrate processing/supplying unit 20.

Further, as illustrated in FIG. 1 and the like, the high-energy ion implanter 100 is configured to generate a beam having a uniform beam convergence and divergence amount, a small orbit deviation, and uniform directivity by adjusting the extraction electrode device (the extraction electrode 40: see FIGS. 2A and 2B) that includes the beam direction adjustment portion provided in the ion beam generation unit 12, the adjustment portion (the horizontal focusing lens 64a and the vertical focusing lens 64b: see FIGS. 5A and 5B) that is provided inside the termination end of the high-energy multi-stage linear acceleration unit 14 and adjusting the beam directivity and the convergence and divergence degree, the electrostatic high-energy beam adjustment portion (the orbit adjusting quadrupole lens 26: see FIGS. 5A and 5B) provided in the energy analysis unit (the beam deflection unit 16: see FIG. 1), and the electrostatic beam focusing/defocusing unit 32 and the electrostatic beam collimator 36 that are provided in the beam transportation unit 18, and to supply the beam to the electrostatic beam scanner 34.

As illustrated in FIGS. 16A and 16B, the electrostatic beam scanner 34 may be configured to temporarily dump the beam in a manner such that the ion beam is deflected toward the further outside of the normal scan range and is led to any one of the left and right beam dump portions 95a and 95b disposed at the front side of the electrostatic beam collimator 36.

Further, the electrostatic beam scanner 34 is configured to apply an offset voltage (a constant voltage for causing a position where the electric field becomes zero to deviate from the horizontal center) for correcting the horizontal deflection of the scan range. Further, the beam scanner 34 constitutes a part of a system that finely adjusts the implantation angle and the implantation position by determining the offset voltage based on the back calculation obtained from the positional deviation when the beam adjusted to pass through the vicinity of the center of the electrostatic beam scanner 34 reaches the wafer.

In the above-described embodiment, the electrostatic beam collimator has been described as an example, but a magnetic field type beam collimator may be employed if necessary.

Figure 19:
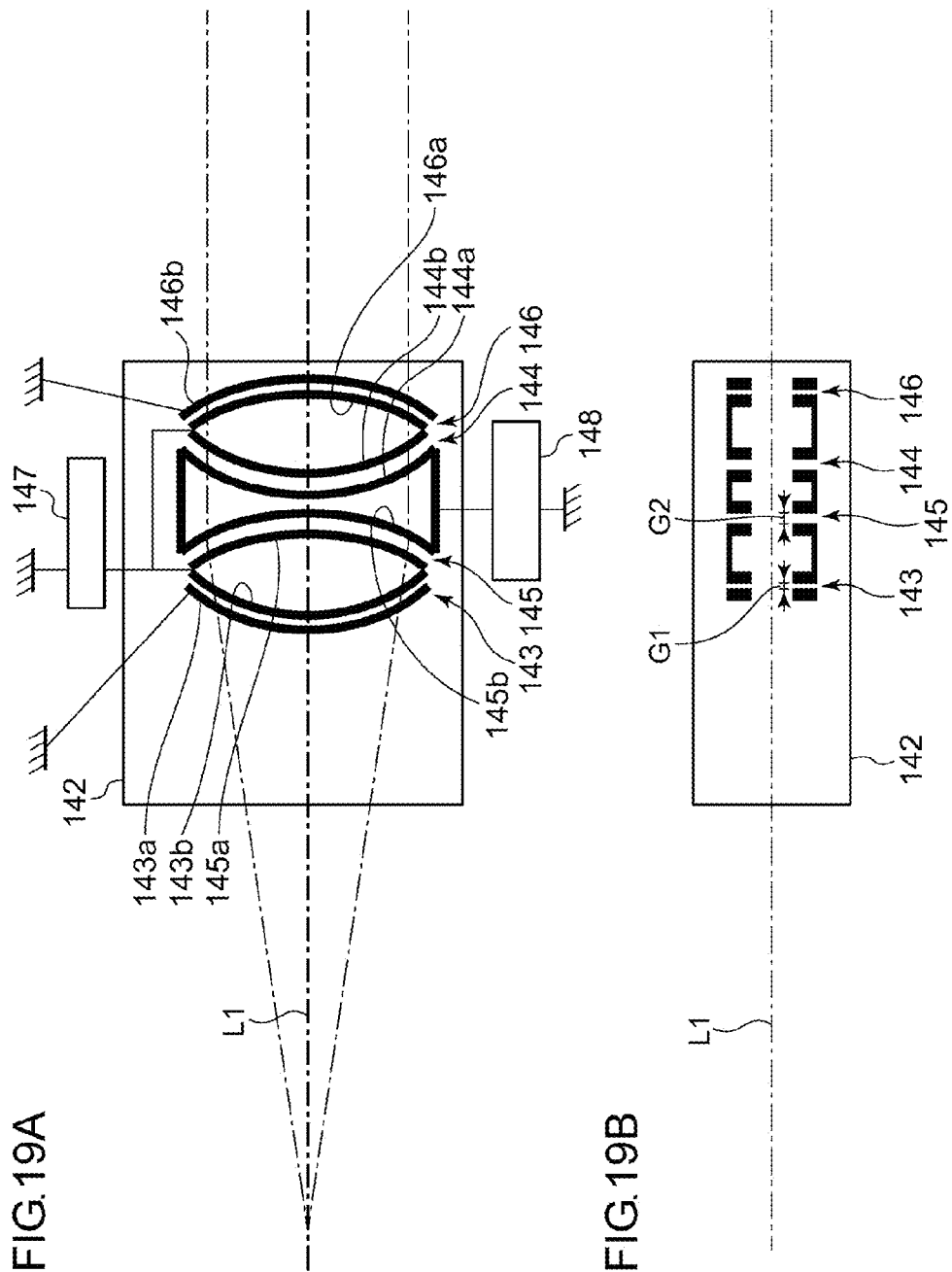
FIG. 19A is a top view illustrating a schematic configuration of a beam collimator according to this embodiment.
FIG. 19B is a side view illustrating a schematic configuration of the beam collimator according to this embodiment.

FIG. 19A is a top view illustrating a schematic configuration of the beam collimator according to the aspect of the embodiment, and FIG. 19B is a side view illustrating a schematic configuration of the beam collimator according to the aspect of the embodiment. Furthermore, the same reference numerals will be given to the same components as those of the beam collimator 36 illustrated in FIGS. 6A and 6B, and the description thereof will not be appropriately repeated.

The beam collimator 142 illustrated in FIGS. 19A and 19B is configured as an acceleration-deceleration electrode lens group that includes multiple pairs of acceleration electrodes 143 and 144 and multiple pairs of deceleration electrodes 145 and 146, and is configured to gradually collimate the scanned ion beam. Accordingly, since the voltage applied to one acceleration electrode or one deceleration electrode may be decreased, the power supply may be simplified and decreased in size. Further, the occurrence of the discharge may be also suppressed.

Further, a downstream electrode 143b of the acceleration electrode 143 and an upstream electrode 145a of the deceleration electrode 145 are electrically connected to each other so as to have the same potential, and are connected to a first parallelization power supply 147. Further, a downstream electrode 145b of the deceleration electrode 145 and an upstream electrode 144a of the acceleration electrode 144 are electrically connected to each other so as to have the same potential, and are connected to a second parallelization power supply 148. Further, the downstream electrode 144b of the acceleration electrode 144 and an upstream electrode 146a of the deceleration electrode 146 are electrically connected to each other so as to have the same potential, and are connected to the first parallelization power supply 147. Furthermore, an upstream electrode 143a of the acceleration electrode 143 and a downstream electrode 146b of the deceleration electrode 146 are set to a ground potential. In this way, when the voltages applied to a part of the electrodes are set to the same voltage, the number of the power supplies in use may be decreased.

Furthermore, among the multiple pairs of acceleration electrodes 143 and 144 and the multiple pairs of deceleration electrodes 145 and 146, the electrode 143a as the entrance ground electrode disposed at the most upstream side of the beamline and the electrode 143b adjacent to the electrode 143a may form a first suppression electrode that suppresses the inflow of electrons, and the electrode 146b as the exit ground electrode disposed at the most downstream side of the beamline and the electrode 146a adjacent to the electrode 146b may form a second suppression electrode that suppresses the inflow of electrons. Accordingly, there is no need to separately provide the suppression electrode.

Further, when the voltage applied to the downstream electrode 143b of the acceleration electrode 143 by the first parallelization power supply 147 is indicated by −V1[V] (V1>0), the voltage applied to the downstream electrode 145b of the deceleration electrode 145 by the second parallelization power supply 148 is indicated by V2[V] (V2>0), the gap between two electrodes 143a and 143b of the acceleration electrode 143 is indicated by G1, and the gap between two electrodes 145a and 145b of the deceleration electrode 145 is indicated by G2, the following relation may be satisfied.

$$|V1|/G1=|V1+V2|/G2$$

In this way, when the electric field strength between the electrodes in the acceleration electrode and the deceleration electrode becomes uniform, the ion beam may be collimated while being accelerated and decelerated with a balance.

Further, the beam collimator 142 is formed so that the energy of the ion beam to be directly incident to the beam collimator is equal to the energy of the ion beam directly emitted from the beam collimator. More specifically, in the beam collimator 142, the incident electrode 143a and the emission electrode 146b of the beam collimator 142 are both grounded so that the energy of the ion beam scanned by the beam scanner is equal to the energy of the ion beam collimated by the pair of acceleration electrodes 143 and 144 and the pair of deceleration electrodes 145 and 146, the acceleration gap exit side electrode 143b and 144b and the deceleration gap entrance side electrode 145a and 146a are set to the same positive or negative potential, and the deceleration gap exit side electrode 145b and the acceleration gap entrance side electrode 144a are set to the same positive or negative potential.

Further, in the beam collimator 142, the electrode potentials are set so that the ion beam scanned at both sides of the reference orbit by the beam scanner on the beamline toward the reference orbit by the electric field generated by the pair of electrodes on the scan plane are deflected so as to match the orbit parallel to the reference orbit.

Figure 20:
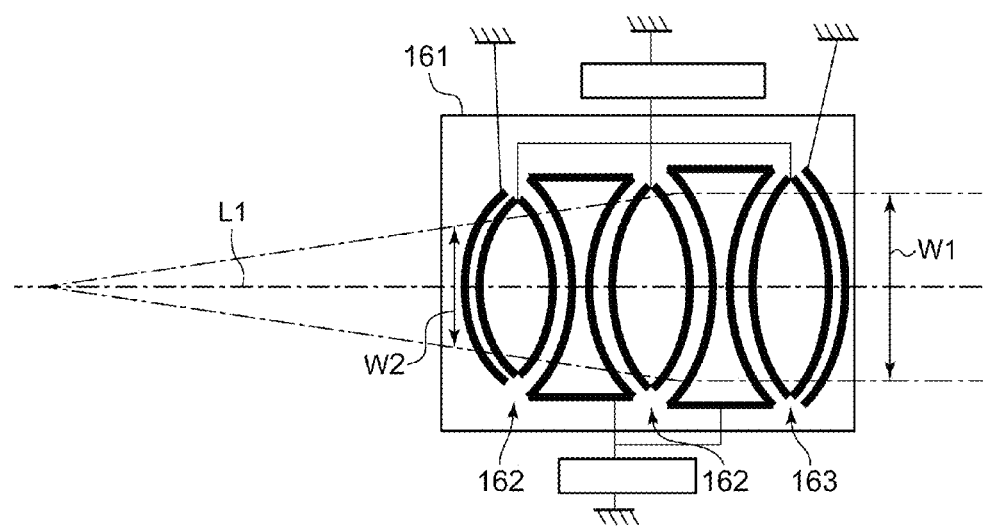
FIG. 20 is a top view illustrating a schematic configuration of a beam collimator according to a modified example of this embodiment.

FIG. 20 is a top view illustrating a schematic configuration of a beam collimator according to a modified example of the embodiment. A beam collimator 161 illustrated in FIG. 20 is provided with three parallelizing lenses 162, 163, and 164 formed by an acceleration electrode and a deceleration electrode. The ion beam that is deflected and scanned by the beam scanner is widened toward the downstream side of the beamline L1. Therefore, each of three parallelizing lenses 162, 163, and 164 is formed so that the width thereof gradually increases from the upstream side toward the downstream side of the beamline L1. Accordingly, the upstream parallelizing lens may be decreased in size.

Furthermore, the beam collimator 161 may be formed so that the width W1 of the collimated ion beam in the scan direction is two times or more the width W2 when the ion beam scanned by the beam scanner is incident to the beam collimator 161. Accordingly, the distance from the beam scanner to the beam collimator may be decreased.

The beam collimator according to the embodiment is formed by a pair of bow-shaped gap electrodes like the acceleration electrode or the deceleration electrode illustrated in FIGS. 6A and 6B and FIGS. 19A to 20. Further, the downstream electrode in the beamline of the pair of acceleration electrodes and the upstream electrode in the beamline of the pair of deceleration electrodes are configured as an electrode unit which is continuously integrated while both ends thereof are connected. Further, in the above-described beam collimator, the incident electrode and the emission electrode have a ground potential. However, when one of the incident electrode and the emission electrode is set to a ground potential and the other thereof is set to a specific potential or both electrodes are set to different specific potentials, it is possible to change the energy of the ion beam emitted after the beam incident to the beam collimator is collimated.

In this way, the high-energy ion implanter according to the embodiment may be operated at a low voltage while keeping the horizontal uniformity of the beam current density of the high-energy ion beam, and may obtain an electric field that does not change the beam energy before and after the beam passes through the beam collimator.

Further, the high-energy ion implanter according to the embodiment is configured to collimate the beam by causing the high-energy ion beam to pass through the elongated electric field. Then, the high-energy ion implanter is configured so that the beam is collimated by a plurality of electrode lens groups capable of accelerating and decelerating the ion beam and the acceleration-deceleration electrode lens group is configured as a pair of bow-shaped gap electrodes lenses, thereby preventing a change in beam energy before and after the ion beam passes therethrough.

Accordingly, the control of the parallelization power supply and the adjustment of the parallelization electric field may be easily performed, and the precision of the parallelization and the angle precision of the collimated beam in the beam traveling direction may be made satisfactory. Further, since a difference in beam path in the horizontal (scan) direction is symmetric, the beamline may be uniform in the horizontal direction, and hence the convergence and divergence uniformity of the beam may be maintained in the high-energy ion beam. As a result, the precision of the parallelization and the angle precision of the collimated beam in the beam traveling direction may be made high. In addition, the density distribution (profile) of the high-energy ion beam and the beam size in the beam scan range may not be substantially changed, and hence the horizontal uniformity of the beam current density may be maintained.

Further, in the beam collimator according to the embodiment disposed at the downstream side of the beam scanner having a small beam scan deflection angle and a beam scan width set as small as possible, the incident beam having a narrow beam scan width may be also gently collimated with high precision to the width in which the wafer may be scanned. As a result, a change in the quality of the beam decreases, and hence the horizontal uniformity of the beam current density may be maintained.

Furthermore, in a case where the acceleration-deceleration electrode lens group includes n pairs of acceleration electrodes and n pairs of deceleration electrodes and a first pair of acceleration electrodes, a first pair of deceleration electrodes, a second pair of acceleration electrodes, a second pair of deceleration electrodes, . . . , n-th (n is an odd number equal to or larger than 1) pair of acceleration electrodes, and n-th pair of deceleration electrodes are disposed in this order along the beamline, the potentials may be set as below. Specifically, in the acceleration-deceleration electrode lens group, the first potential of the entrance electrode of the first pair of acceleration electrodes is set to a ground potential, the second potentials of the exit electrode of the first pair of acceleration electrodes and the entrance electrode of the first pair of deceleration electrodes are set to $-V1[V]$ ($V1>0$), the third potentials of the exit electrode of the first pair of deceleration electrodes and the entrance electrode of the second pair of acceleration electrodes are set to $V2[V]$ ($V2>0$), the fourth potentials of the exit electrode of the second pair of acceleration electrodes and the entrance electrode of the second pair of deceleration electrodes are set to $-V1[V]$ ($V1>0$), the fifth potentials of the exit electrode of the second pair of deceleration electrodes and the entrance electrode of the third pair of acceleration electrodes are set to $V2[V]$ ($V2>0$), and the $(2n+1)$-th potential of the exit electrode of the n-th pair of acceleration electrodes is set to the ground potential. Here, the second potential and the third potential may be set so as to satisfy the relation of $V1=V2$ or the relation of $V1 \neq V2$.

Figure 21A:
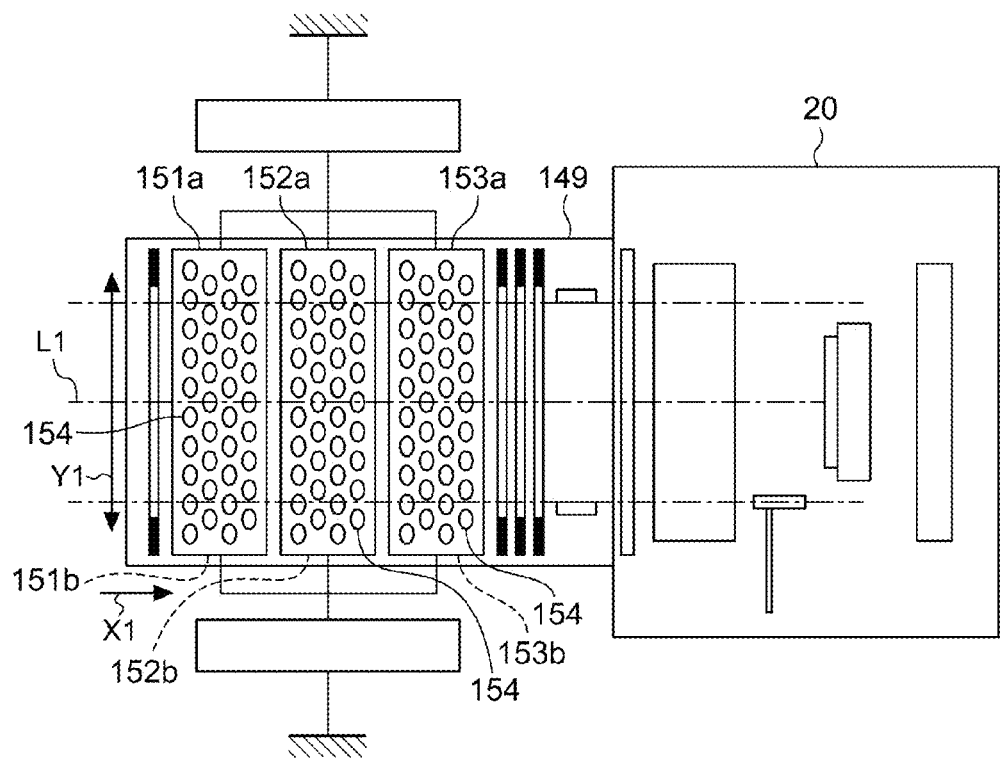
FIG. 21A is a top view illustrating a schematic configuration of a final energy filter to a substrate processing/supplying unit according to another modified example of this embodiment.
Figure 21B:
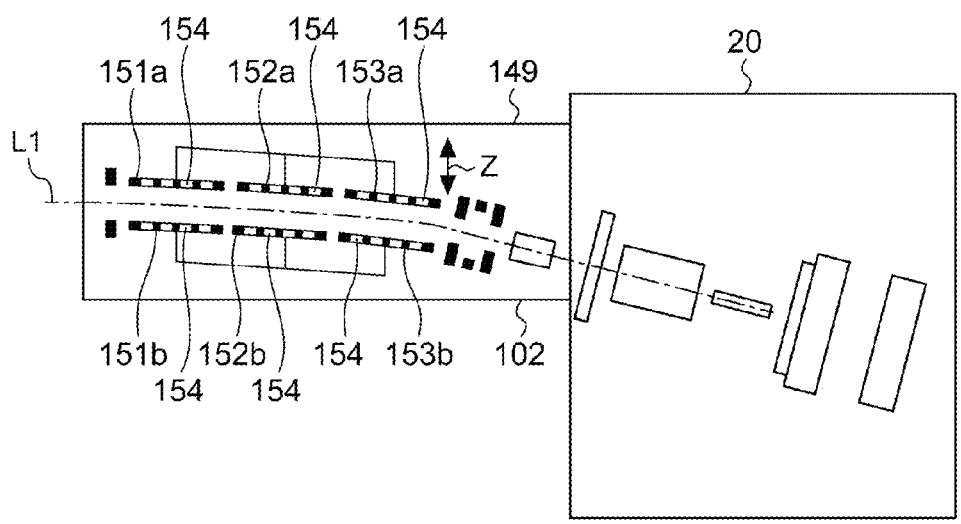
FIG. 21B is a side view illustrating a schematic configuration of a final energy filter to a substrate processing/supplying unit according to the modified example of this embodiment.

FIG. 21A is a top view illustrating a schematic configuration of a final energy filter to a substrate processing/supplying unit according to another modified example of this embodiment, and FIG. 21B is a side view illustrating a schematic configuration of a final energy filter to a substrate processing/supplying unit according to the modified example of this embodiment.

A final energy filter 149 illustrated in FIGS. 21A and 21B includes three pairs of deflection electrodes 151a, 151b, 152a, 152b, 153a, and 153b that deflect the scanned ion beam in the direction Z perpendicular to the scan direction Y1. The deflection electrodes 151a, 151b, 152a, 152b, 153a, and 153b are disposed inside the AEF chamber 102 as the vacuum chamber. Each deflection electrode is provided with a plurality of holes 154 that communicate with the space above or below the beamline L1. The plurality of holes 154 are formed with an even or uneven arrangement so as to uniformly maintain the electric field.

From the electric viewpoint, it is desirable that the deflection electrode is formed as a single body without any hole in that the electric field does not become weak. However, in a case of the deflection electrode without any hole, the space between the facing deflection electrodes is almost sealed, and hence the vacuum degree is degraded. In particular, the gap between the deflection electrodes of the final energy filter is a region where a gas generated by implanting the ion beam into the resist wafer in the downstream substrate processing/supplying unit 20 flows and the gas is not easily evacuated to the outside. As a result, it is considered that the possibility of discharge increases or the beam loss increases. Therefore, when a hole is formed in the electrode so as to improve the conductance, a satisfactory vacuum state may be maintained. Furthermore, the weakness of the electric field caused by the hole may be compensated by the additional voltage.

In the final energy filter 149, the plurality of holes 154 are distributed in a direction (the scan direction Y1) intersecting the beam traveling direction X1, and hence it is possible to suppress the deflection of the ion beam from being non-uniform in the scan direction Y1.

While the invention has been described by referring to the above-described embodiment, the invention is not limited to the above-described embodiment, and the appropriate combination of the configurations of the embodiment or the substitution thereof is also included in the invention. Further, the combination of the embodiments or the process sequence thereof may be appropriately set or various modifications in design may be added to the embodiments based on the knowledge of the person skilled in the art. An embodiment having such modifications may be also included in the scope of the invention.

Hereinafter, each aspect of the invention will be described according to embodiments.

The high-energy ion implanter 100 includes: a beam extraction system (ion beam generation unit 12) that generates an ion beam by extracting ions generated by an ion source from a static electric field; a high-frequency accelerator (high-energy multi-stage linear acceleration unit 14) that further accelerates the extracted ion beam; at least one convergence element that is used for adjusting a beam size (spatial distribution) of the accelerated beam; and at least one deflection electromagnet that is used as the energy analysis electromagnet 24, and, the energy spread confining slit 27, and the energy analysis slit 28 are installed to the downstream side of the energy analysis electromagnet 24.

The convergence element (the focusing and defocusing lens 64 and the quadrupole lens 26) used for adjusting the beam size (the spatial distribution of ions) is installed between the high-frequency accelerator (the first linear accelerator 15a and the second linear accelerator 15b) and the energy analysis electromagnet 24 and between the energy analysis electromagnet 24 and the energy analysis slit 28, and a beam (a beam transported with energy as is extracted without applying a high-frequency electric field to the high-frequency accelerator) having no energy spread is adjusted to be focused at the position of the energy analysis slit 28.

The orbit of each ion configuring the ion beam having an energy spread is caused to spatially spread within the deflection face in accordance with energy by the energy analysis electromagnet 24 (energy dispersion). The energy spread confining slit 27 is disposed at a position at which the energy dispersion is of the same level as the beam size of a beam having no energy spread on the upstream side of the energy analysis slit 28. The position is near the exit of the energy analysis electromagnet 24.

In addition, the horizontal focusing quadrupole lens 26 is inserted between the energy spread confining slit 27 and the energy analysis slit 28, and the position at which the width of the beam having no energy spread is minimum is moved to the upstream side of the beamline, whereby a gap between the energy spread confining slit 27 and the energy analysis slit 28 decreases.

The energy analysis electromagnet 24 and the angle deflection electromagnet 30 are electromagnets having the same shape and are configured to operate under the same operating condition.

The energy analysis electromagnet 24 may be configured to fix the magnetic field to a value corresponding to the implantation energy but not to adjust the magnetic field used for increasing or decreasing the beam current. Alternatively, the energy analysis electromagnet 24 may be configured to fix the magnetic field to a value corresponding to the implantation energy and adjusts the beam current by adjusting the acceleration voltage and the phase of the high-frequency acceleration unit. At least one of the plurality of deflection electromagnets may include a face angle adjusting device that is used for adjusting the shape of the cross-section of the beam.

Furthermore, a configuration in which the arbitrary combination of the above-described components or the component or the expression of the invention is substituted in the method, the device, and the system is valid as the aspect of the invention.

Priority is claimed to Japanese Patent Application No. 2013-131358 filed Jun. 29, 2013, the entire content of which is incorporated herein by reference.

What is claimed is:

1. A high-frequency acceleration type ion acceleration and transportation apparatus having high energy precision that is a beamline after an ion beam is accelerated by a high-frequency acceleration-type acceleration system having an energy spread with respect to set beam energy, the high-frequency acceleration type ion acceleration and transportation apparatus having high energy precision comprising:
   an energy analysis deflection electromagnet; and
   a horizontal beam focusing element,
   wherein a double slit that is configured by an energy spread confining slit and an energy analysis slit is additionally disposed at a position at which energy dispersion and a beam size are to be appropriate, wherein the position is determined based on a condition of the energy analysis deflection electromagnet and the horizontal beam focusing element, and
   wherein the double slit performs energy separation and energy definition and decreases the energy spread of the ion beam by performing adjustment for a smaller energy spread while suppressing a decrease in the amount of a beam current so as to realize required energy precision.

2. The high-frequency acceleration type ion acceleration and transportation apparatus having high energy precision according to claim 1,
   wherein the energy separation and the energy definition are performed by the double slit, and
   wherein a center energy deviation is decreased together with decreasing the energy spread of the ion beam by performing adjustment for a smaller energy spread as possible as can while suppressing a decrease in the amount of the beam current so as to realize the required energy precision.

3. The high-frequency acceleration type ion acceleration and transportation apparatus having high energy precision according to claim 1,
   wherein a deflection unit is configured by a plurality of deflection electromagnets including the energy analysis deflection electromagnet, and
   wherein, by inserting the energy spread confining slit into a place at which a beam width derived from emittance is large not to be ignorable relative to a beam width derived from energy dispersion between the plurality of deflection electromagnets, the energy spread is decreased with a slit width of the energy analysis slit being widened.

4. The high-frequency acceleration type ion acceleration and transportation apparatus having high energy precision according to claim 1,
   wherein a deflection unit is configured by a plurality of deflection electromagnets including the energy analysis deflection electromagnet, and
   wherein, by inserting the energy spread confining slit into a place at which a beam width derived from emittance is large not to be ignorable relative to a beam width derived from energy dispersion between the plurality of deflection electromagnets, a center energy deviation is decreased with a slit width of the energy analysis slit being widened.

5. The high-frequency acceleration type ion acceleration and transportation apparatus having high energy precision according to claim 1,
   wherein a deflection unit is configured by a plurality of deflection electromagnets including the energy analysis deflection electromagnet, and
   wherein, among the plurality of deflection electromagnets, at least one of the deflection electromagnets disposed on the upstream side is used as an energy analysis electromagnet.

6. The high-frequency acceleration type ion acceleration and transportation apparatus having high energy precision according to claim 1, wherein ions having energy different from a reference value by a predetermined value or more are excluded by disposing the energy analysis slit near a position at which a horizontal width of a beam having no energy spread is minimum on the downstream side of the deflection electromagnet used as the energy analysis deflection electromagnet and on the upstream side of the last deflection electromagnet.

7. The high-frequency acceleration type ion acceleration and transportation apparatus having high energy precision according to claim 1, wherein a gap between the energy spread confining slit and the energy analysis slit is decreased by inserting a horizontal focusing quadrupole lens between the energy spread confining slit and the energy analysis slit so that a position at which the width of a beam having no energy spread is minimum is moved to the upstream side of the beamline.

8. The high-frequency acceleration type ion acceleration and transportation apparatus having high energy precision according to claim 3, wherein the plurality of deflection electromagnets are configured by a first deflection electromagnet that is configured as an energy analyzer and a second deflection electromagnet that deflects an orbit of the ion beam.

9. The high-frequency acceleration type ion acceleration and transportation apparatus having high energy precision according to claim 8, wherein the energy spread confining slit and the energy analysis slit are arranged between the first deflection electromagnet and the second deflection electromagnet.

10. The high-frequency acceleration type ion acceleration and transportation apparatus having high energy precision according to claim 3, wherein the plurality of deflection electromagnets are configured to deflect the high-energy ion beam accelerated by an acceleration unit by about 180 degrees.

11. The high-frequency acceleration type ion acceleration and transportation apparatus having high energy precision according to claim 3, wherein the plurality of deflection electromagnets include a first deflection electromagnet and a second deflection electromagnet and are configured such that a deflection angle of each one of the deflection electromagnets is 90 degrees.

12. The high-frequency acceleration type ion acceleration and transportation apparatus having high energy precision according to claim 8, wherein the first deflection electromagnet and the second deflection electromagnet are electromagnets having the same shape and are configured to operate under the same operating condition.

13. The high-frequency acceleration type ion acceleration and transportation apparatus having high energy precision according to claim 1, wherein a magnetic field of a first deflection electromagnet used as the energy analysis deflection electromagnet is fixed at a value corresponding to implantation energy and is not adjusted to increase or decrease the beam current.

14. The high-frequency acceleration type ion acceleration and transportation apparatus having high energy precision according to claim 1, wherein a magnetic field of a first deflection electromagnet used as the energy analysis deflection electromagnet is fixed at a value corresponding to implantation energy and the beam current is controlled by adjusting an acceleration voltage and a phase of a high-frequency acceleration unit.

15. The high-frequency acceleration type ion acceleration and transportation apparatus having high energy precision according to claim 1, wherein a first deflection electromagnet used as the energy analysis deflection electromagnet is manufactured to have a pole face parallelization degree of ±50 μm and suppresses magnetic field non-uniformity to be ±0.01% or less.

16. The high-frequency acceleration type ion acceleration and transportation apparatus having high energy precision according to claim 3, wherein at least one of the plurality of deflection electromagnets includes a pole face angle adjusting device used for adjusting a beam cross-section shape.

17. A high-frequency acceleration type ion acceleration and transportation apparatus having high energy precision that accelerates and transports an ion beam extracted from an ion source, the high-frequency acceleration type ion acceleration and transportation apparatus having high energy precision comprising:
a beam generation unit that includes the ion source and a mass analyzer;
a high-energy multi-stage linear acceleration unit that accelerates the ion beam so as to generate a high-energy ion beam;
a high-energy beam deflection unit that changes the direction of the high-energy ion beam toward an end of a beamline; and
a beam transportation unit that transports the deflected high-energy ion beam to the end of the beamline,
wherein the deflection unit is configured by a plurality of deflection electromagnets, and, among the plurality of deflection electromagnets, at least one deflection electromagnet disposed on the upstream side is used as an energy analysis electromagnet.

18. A high-frequency acceleration type ion acceleration and transportation apparatus having high energy precision that accelerates an ion beam extracted from an ion source, transports the ion beam to a wafer along a beamline, and implants the ion beam into the wafer, the high-frequency acceleration type ion acceleration and transportation apparatus having high energy precision comprising:
a beam generation unit that includes the ion source and a mass analyzer;
a high-energy multi-stage linear acceleration unit that accelerates the ion beam so as to generate a high-energy ion beam;
a high-energy beam deflection unit that changes the direction of the high-energy ion beam toward the wafer;
a beam transportation unit that transports the deflected high-energy ion beam to the wafer; and
a substrate processing/supplying unit that uniformly implants the transported high-energy ion beam into a semiconductor wafer,
wherein the beam transportation unit includes a beam focusing/defocusing element, a beam scanner for a high-energy beam, an electrostatic beam collimator for a high-energy beam, and an electrostatic final energy filter for a high-energy beam,
wherein the high-energy ion beam output from the deflection unit is used for scanning both sides of a reference orbit of the beamline by the beam scanner and is collimated by the beam collimator, and mixed ions which are different in at least one of a mass, an ion charge state, and energy are removed by the final energy filter, and the resultant ion beam is implanted into the wafer,
wherein the deflection unit is configured by a plurality of deflection electromagnets, and, among the plurality of deflection electromagnets, at least one deflection electromagnet disposed on the upstream side is used as an energy analysis electromagnet,
wherein an energy analysis slit is disposed on the downstream side of the deflection electromagnet used as the energy analysis electromagnet and on the upstream side of the last deflection electromagnet,
wherein an energy spread confining slit is disposed on the downstream side of the deflection electromagnet used as the energy analysis electromagnet and on the upstream side of the energy analysis slit, and
wherein ions having energy that is not included in a predetermined range are excluded.

19. A high-frequency acceleration type ion acceleration and transportation apparatus having high energy precision that is a beamline after an ion beam is accelerated by a high-frequency acceleration-type acceleration system having an energy spread with respect to set beam energy, the high-frequency acceleration type ion acceleration and transportation apparatus having high energy precision comprising:
an energy analysis deflection electromagnet; and
a horizontal beam focusing element, and
wherein a double slit that is configured by an energy spread confining slit and an energy analysis slit is disposed at a position at which energy dispersion and a beam size are to be appropriate, wherein the position is determined based on a condition of the energy analysis deflection electromagnet and the horizontal beam convergence element, and
wherein the double slit performs energy separation and energy definition and decreases a center energy deviation while suppressing a decrease in the amount of a beam current so as to realize required energy precision.

* * * * *